United States Patent
Kanthasamy et al.

(10) Patent No.: US 10,331,808 B1
(45) Date of Patent: Jun. 25, 2019

(54) FEATURE RECOGNITION IN ENGINEERING METHODS AND SYSTEMS

(75) Inventors: Kunaseelan Kanthasamy, Irvine, CA (US); Herbert Dennis Hunt, San Francisco, CA (US)

(73) Assignee: MSC.Software Corporation, Newport Beah, CA (US)

( * ) Notice: Subject to any disclaimer, the term of this patent is extended or adjusted under 35 U.S.C. 154(b) by 675 days.

(21) Appl. No.: 13/479,211

(22) Filed: May 23, 2012

(51) Int. Cl.
*G06F 17/50* (2006.01)

(52) U.S. Cl.
CPC ........ *G06F 17/5009* (2013.01); *G06F 17/504* (2013.01); *G06F 17/5036* (2013.01)

(58) Field of Classification Search
CPC ...... G06F 17/50; G06F 17/5018; G06Q 10/06
USPC .............. 703/1, 2; 700/96, 98, 104
See application file for complete search history.

(56) References Cited

U.S. PATENT DOCUMENTS

| | | | | |
|---|---|---|---|---|
| 6,157,435 A * | 12/2000 | Slater | ...................... | G06Q 30/00 348/96 |
| 6,813,395 B1 * | 11/2004 | Kinjo | ................... | G06K 9/4604 382/282 |
| 8,160,984 B2 * | 4/2012 | Hunt et al. | ........................ | 706/46 |
| 8,655,476 B2 * | 2/2014 | Wang et al. | .................. | 700/146 |
| 8,743,364 B2 * | 6/2014 | Krause | ...................... | G01J 3/463 356/408 |
| 2006/0018530 A1 * | 1/2006 | Oaki | ....................... | G06T 7/001 382/144 |
| 2007/0288219 A1 * | 12/2007 | Zafar | ........................ | G03F 1/84 703/14 |
| 2009/0003702 A1 * | 1/2009 | Ofek | ................. | G06F 17/30247 382/181 |
| 2011/0161054 A1 * | 6/2011 | Woolf | ..................... | G06F 17/50 703/1 |
| 2011/0211760 A1 * | 9/2011 | Boncyk | ............. | G06F 17/30259 382/190 |
| 2011/0276159 A1 * | 11/2011 | Chun et al. | ..................... | 700/98 |
| 2012/0173212 A1 * | 7/2012 | Rameau | .................. | G06F 17/50 703/2 |

OTHER PUBLICATIONS

You et al. (Automatic Feature Recognition in Engineering Drawings, 1998 (13 pages)).*

* cited by examiner

*Primary Examiner* — Andre Pierre Louis
(74) *Attorney, Agent, or Firm* — Foley & Lardner LLP

(57) ABSTRACT

A system or method that includes determining a plurality of physical characteristics of a first simulated object. The system or method includes comparing the plurality of physical characteristics of the first simulated object to a plurality of characteristics of a plurality of objects stored on a storage medium. The system or method includes identifying at least one matching object from the plurality of objects stored on the storage medium. The system or method includes comparing at least one physical property of the at least one matching object to at lease one desired physical property of the first simulated object and generating a list of matching objects that meet the at least one desired physical property.

21 Claims, 22 Drawing Sheets

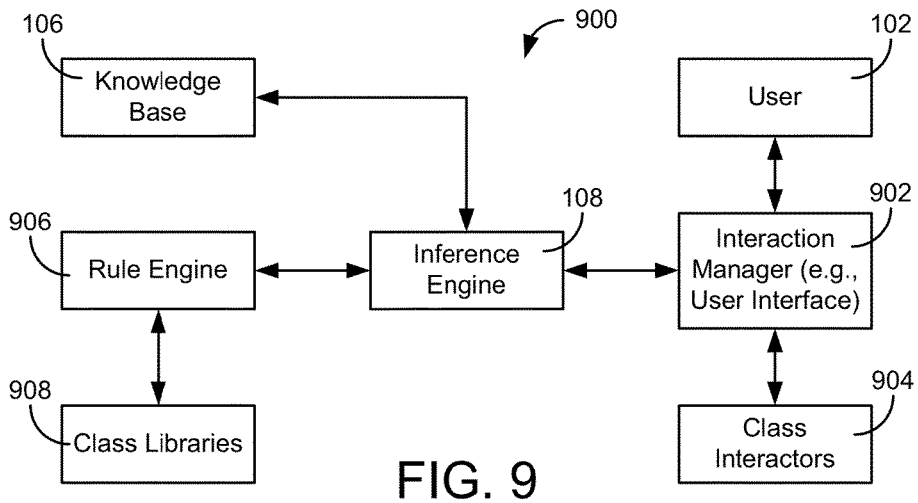
FIG. 9
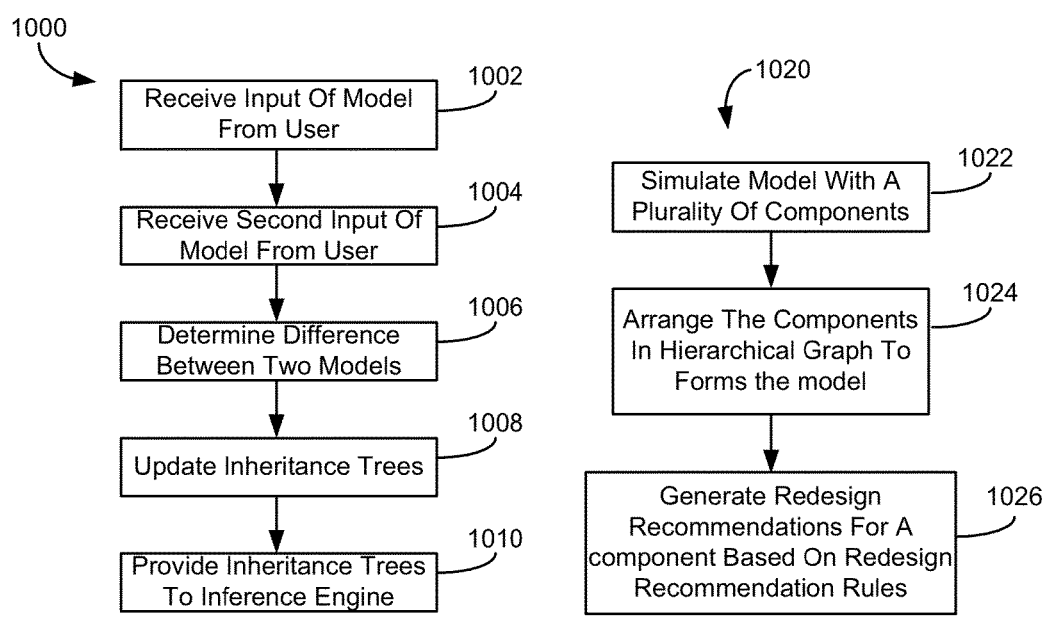
FIG. 10A
FIG. 10B

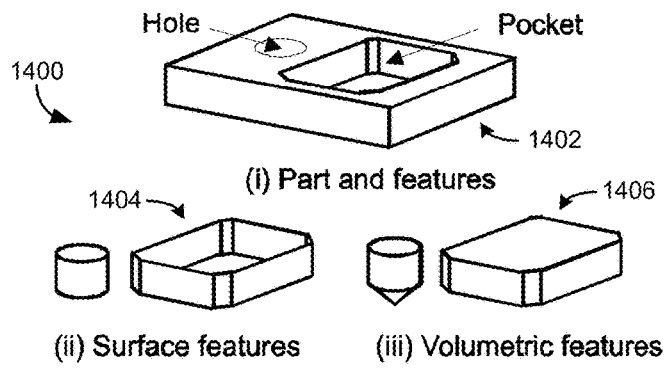
FIG. 14A
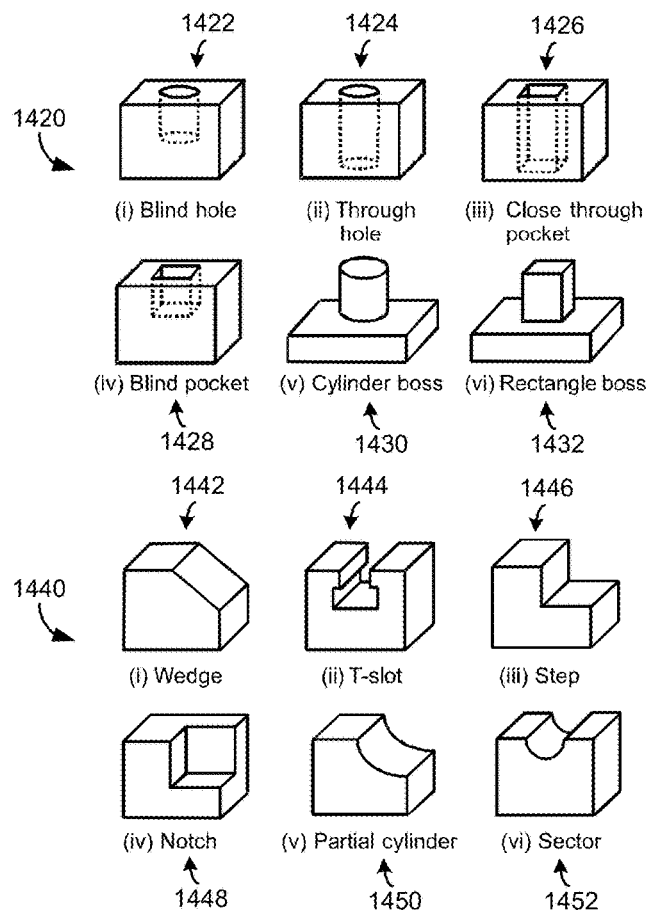
FIG. 14B
FIG. 14C

1700

```
INPUT : B-rep of part.

OUTPUT : Feature type, comprising faces, and dimensions.
get_faces_information
store_original_faces_information
for(each_face)
        get_face_types if
    for(a_cylindrical_face)
            calculate_TNOE
            verify_P/D verify_EAD
            if(feature_is_recognized)
                    retrieve_original_faces_information return(feature_type, comprising_faces, feature_dimensions)
            else
            for(planar_faces)
                    get_face_direction
                    create_block(on_the_feature_volume)
                    give_point(to_the_faces_selected(for block and feature))
                    verify_point_coordinates if(feature_is_recognized)
                            retrieve_original_faces_information return(feature_type, comprising_faces,
                    feature_dimensions)
                    else printf("known feature")
```

FIG. 17

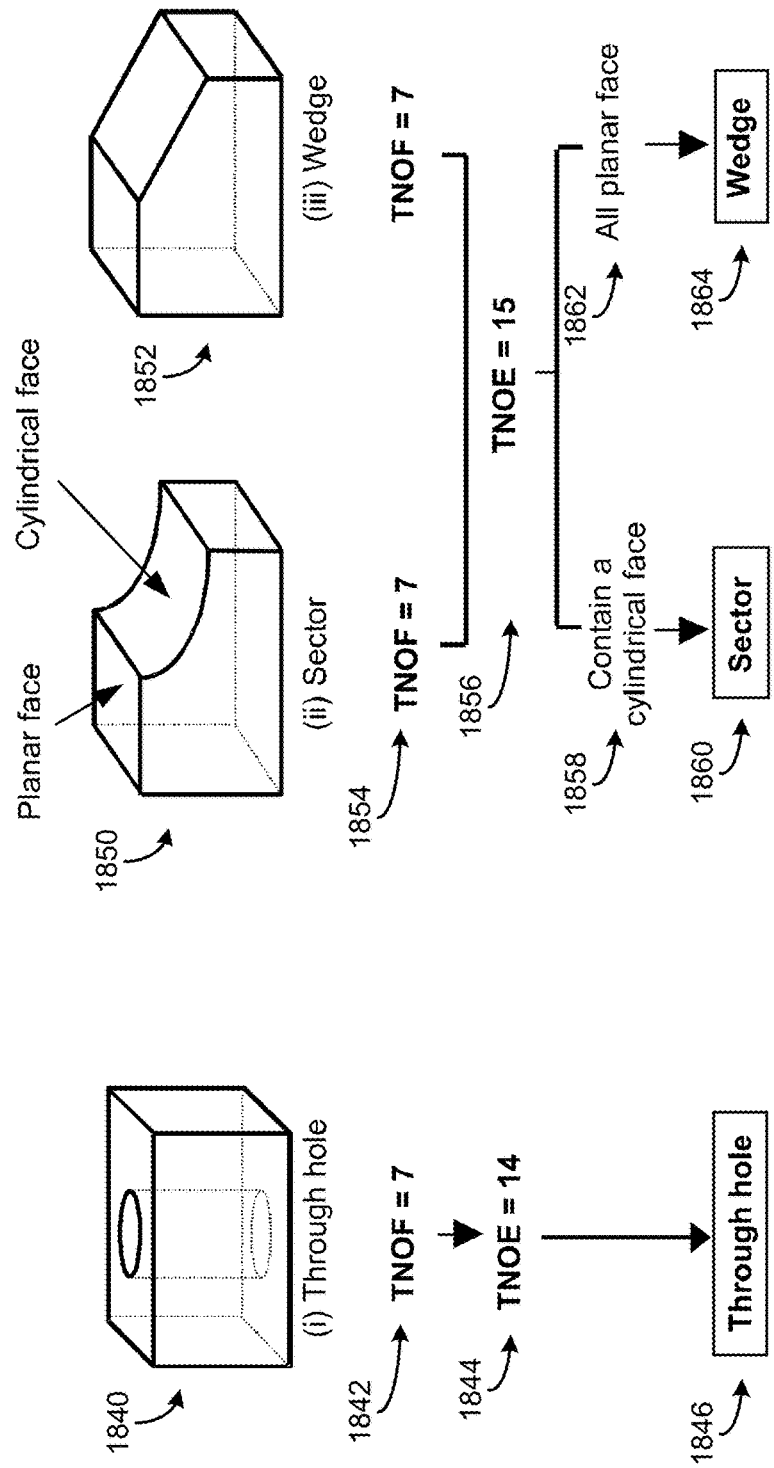

| doublePendulum (Model): | | | | | |
|---|---|---|---|---|---|
| ... | | | | | |
| ground (Ground): | | | | | |
| hasFunctionX | "0.0" | hasFunctionY | "-9.80665" | hasFunctionZ | "0.0" |
| link_1 (RigidBody): | | | | | |
| hasLocationX | "0.25" | hasLocationY | "0.0" | hasLocationZ | "0.0" |
| hasOrientationR1 | "0.0" | hasOrientationR2 | "0.0" | hasOrientationR3 | "0.0" |
| hasRotationSequence | "ZXZ" | | | | |
| hasMassInertiaIxx | "5.557941E-04" | hasMassInertiaIyy | "3.288061E-02" | hasMassInertiaIzz | "3.287534E-02" |
| hasMassInertiaIxy | "0.0" | hasMassInertiaIxz | "0.0" | hasMassInertiaIyz | "0.0" |
| hasMass | "1.346567" | | | | |
| link_2 (RigidBody): | | | | | |
| hasLocationX | "0.75" | hasLocationY | "0.0" | hasLocationZ | "0.05" |
| hasOrientationR1 | "0.0" | hasOrientationR2 | "0.0" | hasOrientationR3 | "0.0" |
| hasRotationSequence | "ZXZ" | | | | |
| hasMassInertiaIxx | "5.557941E-04" | hasMassInertiaIyy | "3.288061E-02" | hasMassInertiaIzz | "3.287534E-02" |
| hasMassInertiaIxy | "0.0" | hasMassInertiaIxz | "0.0" | hasMassInertiaIyz | "0.0" |
| hasMass | "1.346567" | | | | |
| hinge_1 (RevoluteJoint): | | | | | |
| hasLocationX | "0.0" | hasLocationY | "0.0" | hasLocationZ | "-0.025" |
| hasDirectionX | "0.0" | hasDirectionY | "0.0" | hasDirectionZ | "1.0" |
| hinge_2 (RevoluteJoint): | | | | | |
| hasLocationX | "0.5" | hasLocationY | "0.0" | hasLocationZ | "0.05" |
| hasDirectionX | "0.0" | hasDirectionY | "0.0" | hasDirectionZ | "1.0" |

FIG. 21

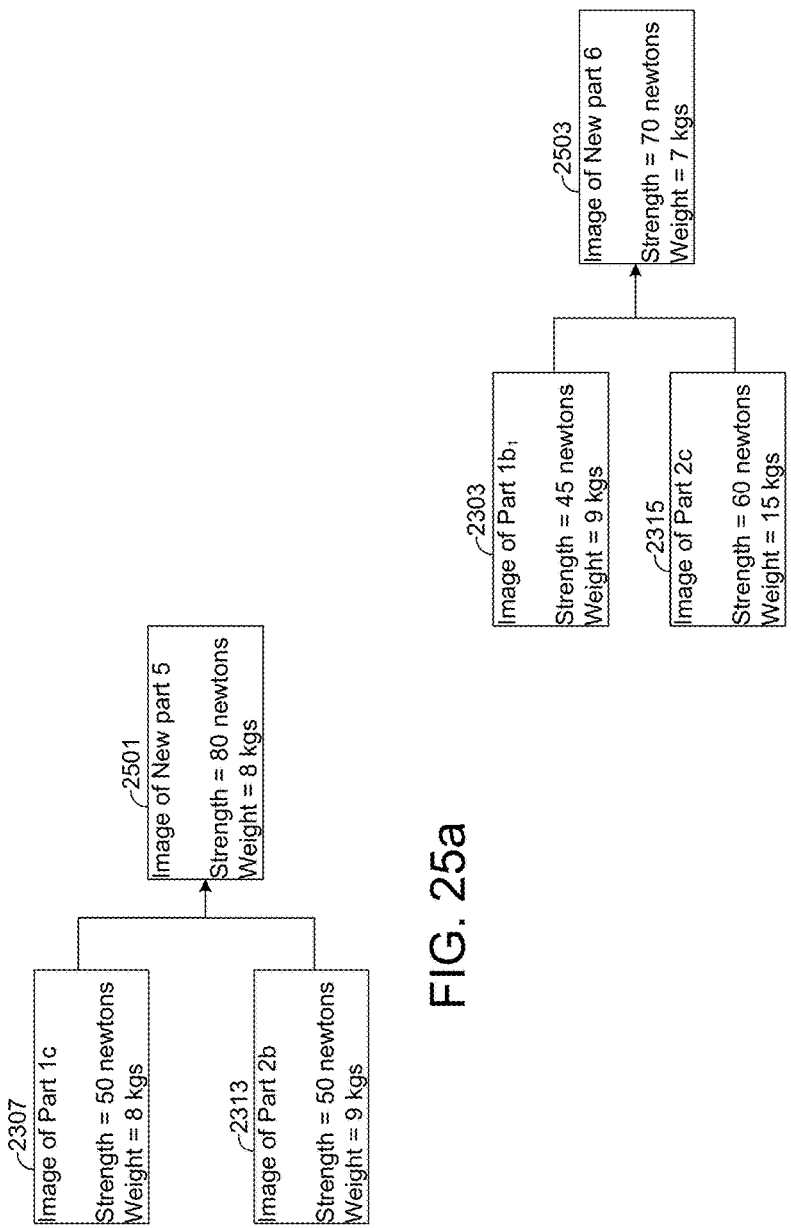

FEATURE RECOGNITION IN ENGINEERING METHODS AND SYSTEMS

BACKGROUND

The present disclosure generally relates to the field of artificial intelligence in the area of CAD tools. More particularly, the present disclosure relates to the use of artificial intelligence rules in computer aided engineering (CAE) programs and to a similar parts recommendation system using the artificial intelligence rules in the CAE programs.

Many important characteristics of advanced computing applications are changing the way engineers interact with computers and computer programs. New approaches based on artificial intelligence (AI) may be used in various field of engineering. Analysis-based design improvement is an example of an engineering task that may apply the use of AI systems.

Finite element analysis (FEA) is one of the most extensively used numerical methods in the engineering product development process. Knowledge based engineering (KBE) techniques have been applied to FEA to teach, advise, and automate the FEA pre-processing phase mainly involving automatic mesh generation, and verifying calculations. However, the use of AI methods is almost absent in the post-processing phase and the subsequent design modification and improvement of designs. Many early examples present a rule-based approach to automate the optimization of simple components or geometric shapes. KBE applications for analysis-based design improvement are quite scarce, although the need for linking intelligent programs to structural analysis in design is prevalent.

Various software and hardware components are frequently required to perform both geometric modeling and engineering analysis. An independent intelligent advisory system for decision support within the analysis-based design improvement process can be applied more easily. Moreover, using a qualitative description of engineering analysis results, such a system can be more general and cover a wider range of application areas. Intelligent interpretation of analysis results can be used to choose the most suitable design modifications. Thus, what is needed is a system for and a method of extracting meaningful qualitative design information from simulation results and to couple this information to a design modification system as a higher level of representation.

SUMMARY

Embodiments relate to a system or method that includes determining a plurality of physical characteristics of a first simulated object. The system or method includes comparing the plurality of physical characteristics of the first simulated object to a plurality of characteristics of a plurality of objects stored on a storage medium. The system or method includes identifying at least one matching object from the plurality of objects stored on the storage medium. The system or method includes comparing at least one physical property of the at least one matching object to at lease one desired physical property of the first simulated object and generating a list of matching objects that meet the at least one desired physical property.

Embodiments relate to a system that has a processor in communication with a non-transitory storage media, the processor is configured to determine a plurality of physical characteristics of a first simulated object, and compare the plurality of physical characteristics of the first simulated object to a plurality of characteristics of a plurality of objects stored on a storage medium. The processor based on the comparison can identify at least one matching object from the plurality of objects stored on the storage medium and the processor can compare at least one physical property of the at least one matching object to at lease one desired physical property of the first simulated object. The processor can generate a list of matching objects that meet the at least one desired physical property.

Embodiments relate to an apparatus that includes a means for determining a plurality of physical characteristics of a first simulated object, a means for comparing the plurality of physical characteristics of the first simulated object to a plurality of characteristics of a plurality of objects stored on a storage medium. Based on the comparison the apparatus includes a means for identifying at least one matching object from the plurality of objects stored on the storage medium. The apparatus includes a means for comparing at least one physical property of the at least one matching object to at lease one desired physical property of the first simulated object and a means for generating a list of matching objects that meet the at least one desired physical property.

Alternative exemplary embodiments relate to other features and combinations of features as may be generally recited in the claims. Embodiments described below can allow parallel processing of each component. Parallel processing indicates that each component irrespective of the other components of the model may be sent to the solver or other modules. Implementations provide a user a level of detail and a level of abstraction display. The user may choose a level of detail and a level of abstraction to view.

BRIEF DESCRIPTION OF THE FIGURES

The disclosure will become more fully understood from the following detailed description, taken in conjunction with the accompanying figures, wherein like reference numerals refer to like elements, in which:

FIG. 9 is a general block diagram of a rule-based suggestion engine according to another exemplary embodiment;

FIG. 10A is a flow chart of a process of using inheritance trees in the systems and methods of the present disclosure, according to an exemplary embodiment;

FIG. 10B is a flow chart of a process, according to an exemplary embodiment;

FIGS. 14A-C are illustrations of an example defeaturing process, according to an exemplary embodiment;

FIG. 17 is pseudocode for executing a feature identification step of the feature recognition process of FIG. 16, according to an exemplary embodiment;

FIGS. 18A-D are examples of the feature recognition process of FIG. 16, according to exemplary embodiments;

FIG. 21 is a table illustrating case-specific rules applied to an object created using the systems and methods of the present disclosure, according to an exemplary embodiment.

FIG. 25a illustrates how the system may generate new parts based on previously generated results.

FIG. 25b illustrates how the system may generate new parts based on previously generated results.

DETAILED DESCRIPTION OF THE EXEMPLARY EMBODIMENTS

Before turning to the figures, which illustrate the exemplary embodiments in detail, it should be understood that the application is not limited to the details or methodology set forth in the description or illustrated in the figures. It should also be understood that the terminology is for the purpose of description only and should not be regarded as limiting.

Referring generally to the figures, systems and methods for using a rule-based suggestion engine to implement AI in design modifications is shown and described. The rule-based suggestion engine is configured to include a knowledge base, which generally includes theoretical and practical knowledge about design and possible design improvements for an object (e.g., a model) created by a user. The rule-based suggestion engine is then configured to use the knowledge to generate the possible design improvements in one embodiment. The rule-based suggestion engine is then configured to provide a user interface for allowing a user to access the various processes of the rule-based suggestion engine in one embodiment. The user may interact with the rule-based suggestion engine by selecting a suggestion of the engine, by providing data and models to the engine, and indicating user preferences throughout the process of generating the design improvements in one embodiment. By using such a system, the user may obtain an insight into the inference process or obtain more information about certain redesign proposals in one embodiment.

Rule-Based Suggestion Engine

Figure 1:
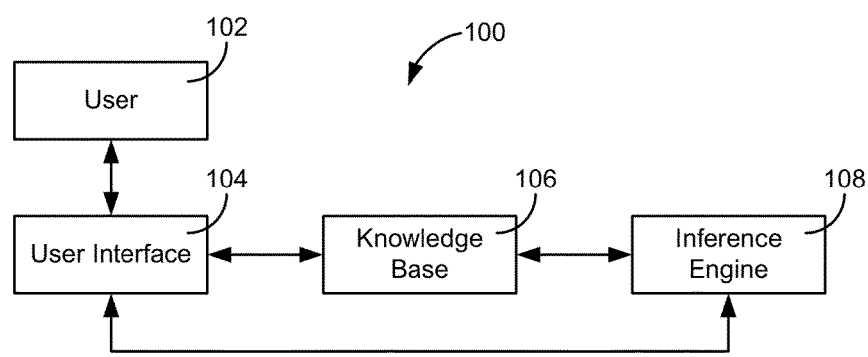
FIG. 1 is a general block diagram of a rule-based suggestion engine according to an exemplary embodiment.

Referring to FIG. 1, a block diagram of the rule-based suggestion engine is shown in accordance with one embodiment. Rule-based suggestion engine 100 is configured to provide a user of the system (e.g., a designer) with design improvement suggestions based on performance analysis for a user-created object (e.g., a model or other structure). In other words, rule-based suggestion engine 100 can act as a solver, providing user 102 with suggestions based on an input from user 102. Rule-based suggestion engine 100 may be part of a computer program configured to allow a user to create or design a model. The model may be any type of object or structure being designed by a user on a computer program.

Rule-based suggestion engine 100 is shown to include a user interface 104 for receiving a user input from a user 102. The user input may relate to a selection of a suggestion provided by rule-based suggestion engine 100, to a user preference or suggestion to rule-based suggestion engine 100, or otherwise. For example, a user may indicate which of a set of suggestions to accept or decline, may set limits for objects to be generated by inference engine 108, or otherwise.

User interface 104 may generally be configured to display suggestions for redesign of an object to a user. These suggestions may be default suggestions, suggestions generated by inference engine 108, or a combination of the two. The suggestions may be presented in pictorial form (e.g., example drawings of the object as shown in FIGS. 2A-D, or any geometric representation of the object), in textual form (e.g., a text description of the object or the changes in the object), or a combination of the two. The description in pictorial form or textual form may include an explanation as to why the suggestion is being offered and an explanation as how the suggestions were decided upon by rule-based suggestion engine 100. In one embodiment, the suggestions may be accompanied with the simulated numerical results for each suggestion. The numerical results may be associated with the property of the object that is being optimized. For example, in FIGS. 2A-2D the stress load bearing is being optimized. Accordingly, the maximum load that each suggestion from FIGS. 2B-2D is able to withstand may be calculated and displayed with each suggestion.

In one embodiment, rule-based suggestion engine 100 may use user interface 104 to provide suggestions to user 102 as the user is designing an object. For example, if rule-based suggestion engine 100 determines that a newly created object by user 102 has a design flaw, then user interface 104 may be configured to alert user 102 by providing a description of the design flaw, along with suggestions for improving the design of the object. In other words, rule-based suggestion engine 100 may interact with user 102 in "real-time" using user interface 104. This process is described in greater detail in FIG. 6.

Rule-based suggestion engine 100 further includes a knowledge base 106. Knowledge base 106 is configured to store rules and properties relating to the objects, as well as types of objects that may be presented to user 102 via inference engine 108. In general, knowledge base 106 stores data relating to previous knowledge about the object. For example, knowledge base 106 may store rules relating to how an object is to be analyzed. As another example, knowledge base 106 may store rules for how to define a status of the object. As yet another example, knowledge base 106 may store rules for determining when or why to propose a redesign of an object. As yet another example, knowledge base 106 may store material properties and other properties relating to the object. These rules may be user specified (e.g., a user knowledgeable of the limitations and specifications of the object), may be provided by an outside source (e.g., a source not associated with the rule-based suggestion engine 100), may be based on manufacturing processes and other manufacturer information of the object, or otherwise. The data stored at knowledge base 106 is described in greater detail in FIG. 4.

Rule-based suggestion engine 100 further includes an inference engine 108. Inference engine 108 is configured to use the data from knowledge base 106 to determine suggestions to provide to the user 102 based on various properties and data. For example, inference engine 108 may analyze or define a status of an object, determine whether redesign of the object is needed, determine what recommendations or suggestions to provide to user 102, etc. In one embodiment, inference engine 108 uses previously created objects, values, attributes, constraints, rules, or available parameters (created possibly by other users) from knowledge base 106, the objects that were used in other applications as the suggestions to user 102. In another embodiment, inference engine 108 may create an object, values, attributes, constraints, rules or available parameters using the rules and data stored in knowledge base 106. In yet another embodiment, the user may have previously chosen the suggestion as a suitable replacement for a component. The activities of inference engine 108 is described in greater detail in FIG. 6.

Figure 2A:
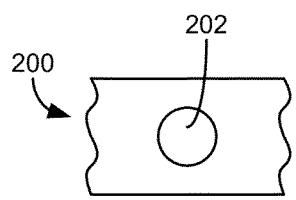
FIGS. 2A-D illustrate an example of redesigning a component using the rule-based suggestion engine illustrated in FIG. 1 according to an exemplary embodiment.
Figure 2B:
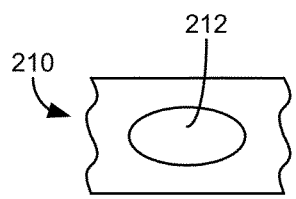
Figure 2C:
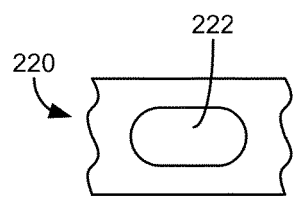
Figure 2D:
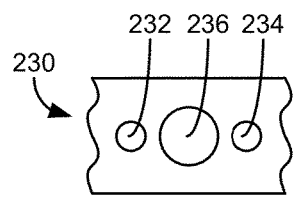

Referring to FIGS. 2A-D, an example object (e.g., a plate) is shown that may be redesigned. In FIG. 2A, object 200 is shown with a hole 202. Object 200 may be an object created by user 102, and may be provided to inference engine 108 for determining suggestions or improvements to object 200. User 102 may manually provide object 200 for analysis, or a computer program associated with rule-based suggestion system 100 may automatically take the user-created object 200 and perform the analysis on the object. When inference engine 108 receives object 200, it may be determined that local stress gradients around hole 202 should be reduced (e.g., when applied, hole 202 of object 200 will have too much applied stress to it).

Using inference engine 108 and knowledge base 106 (e.g., previous knowledge of objects similar to object 200), rule-based suggestion engine 100 may generate one or more suggestions to user 102 in the form of objects 210, 220, 230 of FIGS. 2B-D. For example, in FIG. 2B, rule-based suggestion engine 100 may suggest that hole 212 of object 210 be widened to reduce stress or to maximize performance. As another example, in FIG. 2C, rule-based suggestion engine 100 may suggest that hole 222 of object 220 be more rectangular to reduce stress. As yet another example, in FIG. 2D, rule-based suggestion engine 100 may suggest the creation of additional holes 232, 234 in object 230 in order to reduce stress on hole 236. Rule-based suggestion engine 100 may provide these suggestions as a result of determining that the stress on hole 202 in object 200 would be too great. With each of these suggestions the rule-based suggestion engine 100 may generate the maximum stress value for each suggestion compared to the original. In one embodiment, the percentage of the improvement in the stress handling capability may be displayed. In another embodiment, the option that has the best percentage improvement from the original is identified. The best option may be identified by displaying the best option in a different color, flashing color, highlighted, popup or logo of the manufacturer.

Figure 3:
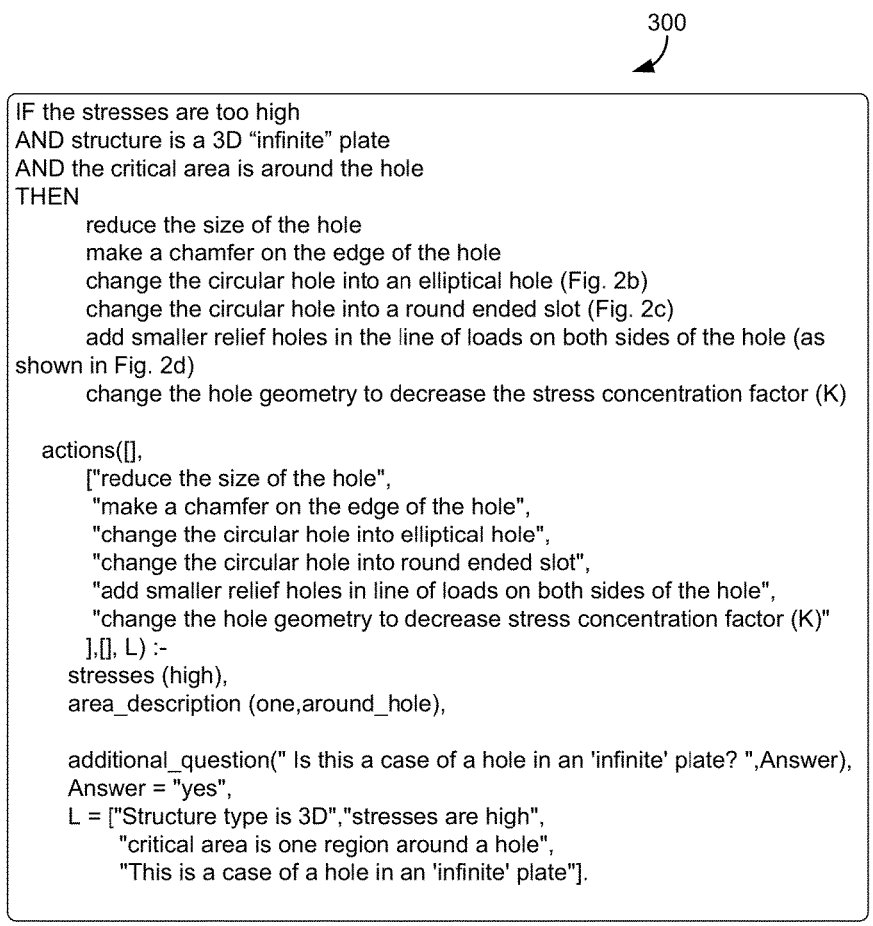
FIG. 3 is pseudocode for executing a process of redesigning the components of FIGS. 2A-D, according to an exemplary embodiment.

Referring also to FIG. 3, pseudocode 300 is shown for executing the processes described above that are used to generate objects 210, 220, 230 of FIGS. 2B-D. For example, referring also to FIGS. 2A-D, pseudocode 300 includes determining if the stresses are deemed to be to high for the object 200 of FIG. 2A, if object 200 is three-dimensional (3D) and relatively infinite (e.g., the boundary conditions of object 200 as shown is not significant), and if the critical area of object 200 is around the hole 202. If these properties are met, then pseudocode 300 is used to generate redesign suggestions.

In FIG. 3, various suggestions for redesigning the object are listed. The hole size may be reduced, a chamfer on the edge of the hole may be made, the hole shape may be changed into an elliptical hole or a round ended slot, smaller relief holes may be added, or the hole geometry may otherwise be changed. These suggestions may be generated based on information from knowledge base 106 or previously chosen user preferences. For example, objects similar to object 200 may be queried in knowledge base 106, and the properties of the previous object may be used to determine suggestions. As another example, various object rules defined in knowledge base 106 may be used to determine the types of modifications that may be made to the hole (e.g., to determine the specific suggestions listed in the code).

While pseudocode is used in FIG. 3, it should be understood that the type of coding language used to complete the systems and methods described herein is not limited. In one embodiment, Prolog® software may be used to code the redesign and suggestion process. In other embodiments, other rule-based or suitable programming languages may be used.

Figure 4:
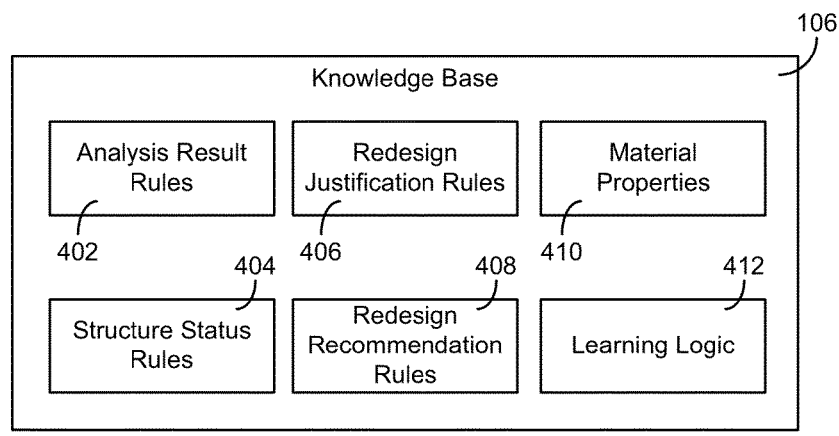
FIG. 4 is a more detailed block diagram of the knowledge base of FIG. 1, according to an exemplary embodiment.

Referring now to FIG. 4, knowledge base 106 is shown in greater detail. Knowledge base 106 includes various rules and properties that may be used by the inference engine 108 to generate suggestions for a user. Knowledge base 106 may be a database, according to one embodiment. Knowledge base 106 may alternatively be a computer program, module, or any type of system for storing rules and properties and providing the rules and properties to another system for analysis.

Knowledge base 106 may include analysis result rules 402 relating to how to evaluate a structure. For example, inference engine 108 may wish to check if an analysis of an object it received is available and reliable. Analysis result rules 402 may include guidelines for how to analyze the object, how to get analysis results of the object, if any analysis of the object is reliable or not, and the like. For example, referring also to FIG. 2A, analysis result rules 402 may be used to determine that a strain-stress analysis is appropriate for object 200.

Knowledge base 106 may include structure status rules 404 relating to how the structure is defined. Structure status rule 404 indicates how a structure should be or may be configured in order to maintain integrity of the structure. In other words, structure status rules may indicate tolerances, dimensions, or other properties that the structure should exhibit, and how to obtain such tolerance, dimensions, and other properties. This includes defining such limits for a particular area or component of an object. For example, also referring to FIG. 2A, hole 202 may be defined as a general area for which an allowable limit should be applied with regards to stress limits. The area may be defined by knowledge base 106 (e.g., using previous knowledge of similar objects to know which areas of the newly created object is most critical), or may be defined by the user.

For example, also referring to FIG. 2A, structure status rules 404 may include defining a stress tolerance for hole 202 of object 200. A difference may be calculated that is representative of the difference between the actual stress tolerance of object 200 and a desired limit. As a result of the application of structure status rules 404, it may be determined that the object is satisfactory or unsatisfactory due to, for example, being not stiff enough, being under-dimensioned and thermally over-loaded, or being over-dimensioned or thermally under-loaded in the embodiment of FIG. 2A.

Knowledge base 106 may include redesign justification rules 406. Redesign justification rules 406 are rules that define if a redesign of an object is justified or necessary. For example, if a redesign of an object would result in a loss of integrity of the structure, rules 406 may be used to make such a determination. Referring also to FIG. 2A, if object 200 is over-dimensioned or thermally under-loaded, redesign justification rules 406 may be used to determine whether object 200 should be redesigned based on how big the problem is. As another example, if object 200 is not stiff enough, then redesign justification rules 406 may automatically indicate that object 200 needs to be redesigned.

Knowledge base 106 may include redesign recommendation rules 408. These rules may define the types of suggestions or redesigned objects inference engine 108 may be allowed to make to a user. For example, if a redesign of a structure causes a structure to change dramatically in tolerance, dimension, or other property, redesign recommendation rules 408 may be used to recommend that inference engine 108 redesign the object. Referring also to FIG. 2A, if object 200 needs to be changed based on redesign justification rules 406, the scale of the design changes (e.g., if the changes need to be significant or are just minor) may be determined using redesign recommendation rules 408, and inference engine 108 may use that determination to help guide the type of redesign of the object. For example, the scale of the design changes may be minor, and therefore inference engine 108 makes minor redesign changes to create objects 210, 220, 230 as a result.

Knowledge base 106 may include material properties 410. Material properties 410 may relate to properties of the materials that are used to create the structure. The various rules 402-408 of knowledge base 106 may use material properties 410. For example, referring also to FIG. 2A, if object 200 is a plate, material properties 410 may include properties relating to the manufacture of the plate. In another embodiment, material property may include the properties of the materials being used. The properties of the material may refer to boiling point, melting point, maximum stress-strain loan, strength, malleability or the like.

Knowledge base 106 may include a learning logic 412 that is configured to learn from various users and databases. In one embodiment, the learning logic 412 may learn which suggestions to provide from a single user. In one implementation, the single user may be the user that is accessing the knowledge base 106. In another embodiment, the learning logic 106 may learn from a plurality of users or a designated group of users. The learning by the knowledge base 106 may include tracking the user's responses to particular circumstances. In particular, the circumstances may include tracking the suggestions a user chooses and the suggestions the user rejects. With respect to a plurality of users, the knowledge base 106 may determine that one or more of the users would have used a different solution than the current user. The knowledge base 106 may allow the inference engine 108 to determine that a high percentage of other users may have selected a different option. In particular, the knowledge base 106 may generate a display adjacent to each suggested redesign that informs the user the percentage of other users that selected each suggested redesign and/or the percentage of times the user has selected particular redesign in the past.

In one embodiment, the learning logic 112 may determine which parts or assemblies that a user is using are similar to the parts or assemblies of other users. Similarity is determined by comparing the geometry of the part, the assembly it belongs to, its material, its relative position within the assembly. By knowing a set of parts are similar and learning the goals that have been pursued from the iterations of the design of these parts the inference engine 108 can determine that for a set of parts there are is a finite set of goals. Further the inference engine 108 can determine the relationship between the goals by monitoring each user's response and outcomes. For example, the relationship between malleability and strength may be inversely proportional to one another, yet both goals may need to be maximized. In one embodiment, once the knowledge base 106 determines or is informed the goal that is being pursued, based on past patterns of users the knowledge base 106 can determine and/or suggest the shortest path to those goals or the path to the best or most optimal result. The leaning logic 112 may learn from the design iterations that did not lead towards the goals in that they did not improve any of the goals or severely damages one or more of the goals.

In another embodiment, the knowledge base 106 may compare and contrast the similarities and differences of parts and assemblies that are suggested or displayed to the user. In one embodiment, the suggested redesigns may include the degree of similarity between the parts and assemblies that are displayed for a user and the parts and assemblies that were displayed to other users who selected the redesign suggestion. By determining the similarity and differences between the parts and assemblies allows the inference engine 108 to ascertain which parts or assemblies are considered equivalent, efficient, or most optimal by various other users. The choices made by the user or users can be extrapolated and the relationship between those choices and improvements to the overall design may be determined by the inference engine 108. The inference engine 108 may further determine the optimal and alternate paths from any starting point to any end point. From determining the optimal and alternate paths the inference engine 108 may be automatically determine the likely goals and how to achieve those likely goals through optimal routes or redesigns. The results to the various redesign choices may be displayed to the user as likely outcomes. When a user improves on the likely outcome of a redesign the inference engine 108 may update the knowledge base 106 to make a record of the parts and assemblies and the user's goal when the user achieved the improvement. In one embodiment the circumstance and the improvement may be stored to have a fingerprint and improve the suggestions by using the fingerprint to identify other similar circumstances.

In one embodiment, the inference engine 108 and the knowledge base 106 may determine that a redesign suggestion is in one or more categories. For example, some redesign suggestions may lead to a desired outcome by improving the design and optimizing the desired goal of the user. Another type of redesign option may be the type of redesign option that was suggested by inference engine 108 and was not selected by the users or only rarely selected by the user. Another type of redesign option may include options that are pursued and found to produce negative outcomes for the user. The negative outcome option may be ascertained by the user choosing a redesign option and then later choosing to undo the redesign. Accordingly, a user may change the design according to a suggestion and the system may advice the user that the outcomes are likely to result in a design failure or an inefficient design or the design may not meet the requirements or constraints that were original set by the user.

Figure 5:
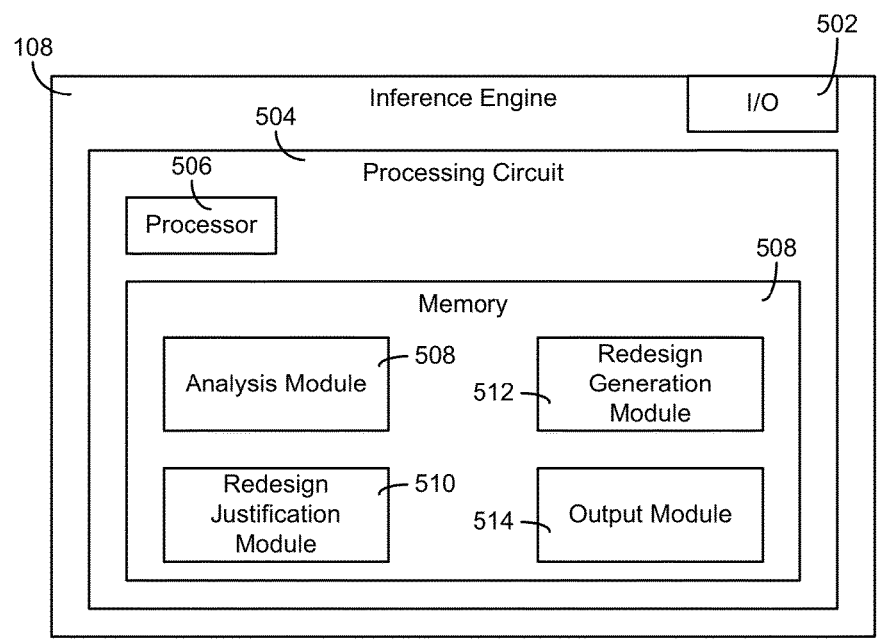
FIG. 5 is a more detailed block diagram of the inference engine of FIG. 1, according to an exemplary embodiment.

Referring now to FIG. 5, inference engine 108 is shown in greater detail. Inference engine 108 is configured to receive data (e.g., rules and properties) from knowledge base 106 and to use the data to generate and recommend suggestions for a user relating to an object. In one embodiment, inference engine 108 receives rules relating to redesigning of an object, and inference engine 108 may generate code for using the rules to determine possible suggestions. Essentially, inference engine 108 provides semantic-based suggestions to a user 102.

Inference engine 108 includes processing electronics 504 for completing the systems and methods of the present disclosure. Processing electronics 504 is shown to include a processor 506 and memory 508. Processor 506 may be implemented as a general purpose processor, an application specific integrated circuit (ASIC), one or more field programmable gate arrays (FPGAs), a group of processing components, or other suitable electronic processing components. Memory 508 is one or more devices (e.g., RAM, ROM, Flash memory, hard disk storage, etc.) for storing data and/or computer code for completing and/or facilitating the various processes described herein. Memory 508 may be or include non-transient volatile memory or non-volatile memory or non-transitory computer readable media. Memory 508 may include database components, object code components, script components, or any other type of information structure for supporting the various activities and information structures described herein. Memory 508 may be communicably connected to processor 506 and includes computer code or instructions for executing one or more processes described herein.

Memory 506 may include various modules for executing the systems and methods described herein. Memory 506 includes an analysis module 508. Analysis module 508 is configured to use rules 402, 404 to analyze an object. The analysis of the object may include the determining the type of analysis to use. For example, the analysis may be a strain-stress analysis, thermal analysis, etc. Upon determining the appropriate types of analysis to apply to the object, analysis module 508 performs the analysis to determine a status of the object. In one embodiment, analysis module 508 may determine that it cannot implement an analysis of the object, and may indicate a need for a manual analysis of the object.

In one embodiment, analysis module 508 may include determining one or more critical areas of the object. Defining the critical areas of the object may include using structure status rules 404, a user input, or a combination thereof. For example, a critical area of an object may be defined as generally as possible by analysis module 508. Then, a user may provide additional information about the object that allows either the user or analysis module to more accurately define the critical area.

Memory 506 further includes a redesign justification module 510. Using the results of analysis module 508 and the various rules of knowledge base 106, redesign justification module 510 determines whether or not design changes are necessary to the structure. For example, using redesign justification rules 406, redesign justification module 510 applies the rules to the object and analysis from analysis module 508 to determine whether a redesign is necessary.

Memory 506 further includes a redesign generation module 512. If redesign of the structure is desired or necessary, redesign generation module 512 may be configured to generate a redesigned object based on the rules 402-408 and material properties 410. For example, redesign generation module 512 receives redesign recommendation rules 408 indicating the types of changes that need to be applied to the object. Redesign generation module 512 then either generates a new object featuring the changes, or determines existing objects used previously that fit the criteria of redesign recommendation rules 408. As another example, using redesign recommendation rules 408, redesign generation module 512 may select from existing objects stored in knowledge base 106.

Redesign generation module 512 may generate suggestions based on various changes. In one embodiment, the material of the original object may be changed and presented to the user as a new object for selection. In another embodiment, geometric changes may be applied to the original object and presented to the user as a new object for selection. In yet another embodiment, the load the object is capable of taking may be changed and presented to the user as a new object for selection. In yet another embodiment, any combination of the above changes may be used.

Memory 506 further includes an output module 514. Output module 514 is configured to take the redesigned objects and to generate a display for a user (via user interface 104) of the objects. Such a display may include any image of the redesigned objects. Further, output module 514 may generate other outputs describing the redesigned objects. A textual description of the redesigned structures may accompany the images. Further, the process of determining why the redesigned structures were generated, and how they were generated, may be provided. One of the reasons presented to the user for generating a redesign may include the component or object as specified by the user does not meet the constraints, rules, attributes of the specification requirements. Another reasons that the redesign may be generated may include the user requesting a redesign. The reasons for the redesign may be displayed on an output device for the user. For example, referring also to FIGS. 2A-D, the following information may be provided when objects 210, 220, 230 are presented to a user: an image of the objects, the dimensions of the objects, a stress tolerance of the objects or a difference in stress tolerances between the objects and the original object 200, material properties of the objects, an explanation of why the shape of the hole of the objects was altered, etc. Inference engine 108 provides an output to user interface 104 via input/output (I/O) interface 502. The user may then select one of the outputted images and use the selected object instead of the original object that may have been created by the user.

Inference engine 108 includes an input/output (I/O) interface 502 configured to receive data from various sources and to transmit data to user interface 104 for display. I/O interface 502 is configured to facilitate communications, either via a wired connection or wirelessly, with user interface 104 and knowledge base 106 as described in the present disclosure.

Figure 6:
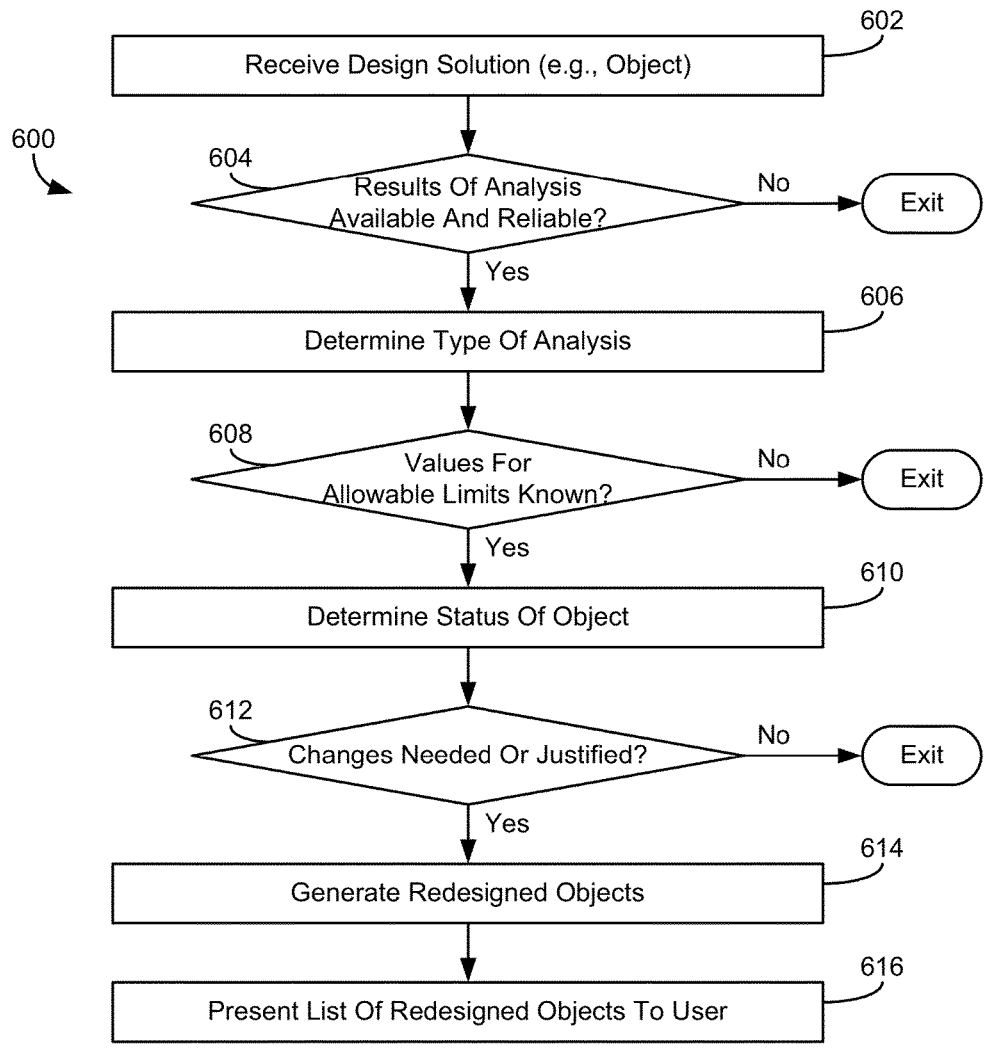
FIG. 6 is a flow chart of a process for determining design improvements for a structure, according to an exemplary embodiment.

Referring now to FIG. 6, a flow chart of a process 600 for determining design improvements for a structure is shown, according to an exemplary embodiment. Process 600 may be executed by, for example, inference engine 108, with input from a user.

Process 600 includes receiving a design solution (e.g., an object, and data relating to object properties) from a user (step 602). The object may be provided automatically by a computer program when the user creates the object, or may be provided directly by a user. Process 600 further includes determining whether results of an analysis of the object would be available and reliable (step 604). Generally speaking, step 604 is used to clarify to the user if, for example, FEA results are reliable and can serve as basic parameters for verifying the created design solution or object. Step 604 includes using rules from a knowledge base to determine what type of analysis to use on an object, and if an analysis is available to use at all. Step 604 includes, if the analysis is possible, determining if the analysis would be reliable or useful for determining if the object is satisfactory. If an analysis is not available or reliable, process 600 may terminate as it cannot perform the analysis needed to determine if the object is satisfactory. Process 600 further includes determining the type of analysis (step 606), if the analysis is available and useful.

Process 600 further includes determining if values for allowable limits for the object are known (step 608). Step 608 may include determining a tolerance for the object, dimensions for the object, etc. Such guidelines for allowable limits may be provided by structure status rules of a knowledge base or otherwise. The limits may relate to a stress level, deformations of the object, temperatures, or any other measurable property. Step 608 may include calculating the allowable limits, if necessary. If allowable limits cannot be determined, then process 600 terminates.

If the allowable limits are available, they may be used to determine a status of the object (step 610). The status of the object relates to whether the object is satisfactory or not (e.g., if the object created by the user is implementable based on the user's plans or if the object meets the design specifications). The status may include defining how the object is unsatisfactory (e.g., if the object to not stiff enough, over or under-dimensioned, etc.). Step 610 may further include defining the types of changes that need to be made to the object (whether it's minor changes or significant changes that are needed). If the object is not satisfactory, a reason for the dissatisfaction may be determined at step 610. One reasons for dissatisfaction may include a comparator that compares the analysis results with the desired specification. In another embodiment, since the solver is running in parallel asysnchronously, if the result from one component's analysis fails, then another components may be determined to be dissatisfactory.

Using the status of the object, process 600 includes determining of changes to the object are needed or justified (step 612) based on the status of the object and the type of change needed. In one embodiment, it may be determined that changes to the object design are needed automatically. In another embodiment, changes to the object may be suggested based on the status of the object, and a user or computer program may decide whether to apply changes to the object. If changes are not applied to the object, then process 600 terminates.

Process 600 further includes generating redesigned objects (step 612) if desired. The redesigned objects may be created by an inference engine 108, according to one embodiment. The objects may be re-created or may be retrieved from a database or other system (i.e., the object previously existed and is selected because it fits the allowable limits defined above). The changes may be based on a chance in material, geometric properties, or load capabilities of the object. Process 600 further includes presenting a list of redesigned objects to the user (step 616) for selection by the user. The list may include images of one or more objects, descriptions of one or more objects, or any other object properties as described above.

Referring generally to FIGS. 1-6 above, the user may have varying degrees of input in the systems and methods described above, and it should be understood that the degree of user participation may vary without departing from the scope of the present disclosure. For example, the inference engine 108 may generate suggestions for the user with little user input beyond the created object, the inference engine 108 may request information from the user relating to the object in general or a critical area of the object more particularly, etc. In the embodiment generally described above, the inference engine uses the user input about the object by comparing the user input to rules in the knowledge base and selecting the best suggestions to provide to the user.

Model Display for a User

Referring to the previous figures, systems and methods were described for allowing a user to choose a redesigned object. The choice may be made after several redesigned objects are displayed for a user. These choices may be provided in "real-time", e.g., as the user is creating an object or model. Referring now to the subsequent figures, systems and methods for displaying objects or models to the user are shown and described. As a user is creating an object, the object is provided to the inference engine 108 or other module. When the user modifies the object, the inference engine 108 or other module may store the type of change to the object instead of the entire object.

The systems and methods described below allow for greater interaction and cooperation between a user and a computer system such as inference engine 108. For example, the work by a user may be done in semantic mode, which allows data related to an object to be linked in a way that it can be used for more effective discovery, automation, integration, and reuse for various modules and users. This allows a user to be guided along by a computer system (e.g., to be given suggestions as the user creates or modifies an object). The user may further control the level of detail that is visible when creating or modifying the object.

Referring to the figures below, systems and methods based on hierarchical definitions of data with AI rule or semantic mode operations are shown and described. The rule-based suggestion engine 100 may be capable of the semantic mode operation based on data abstraction and hierarchical definition of the data organization. Data representations and their associated primitive operations are encapsulated in an abstract data type.

In the embodiments described below, new models may be derived from existing models by inheriting certain data, but at the same time maintaining its individuality by having its own properties that are different from the existing models. In one embodiment, the hierarchical data structure may be an inheritance tree. The inheritance tree is used to describe how different analysis models can be organized and managed hierarchically to rapidly create a new analysis model. In other words, using the inheritance tree, it is possible to reduce loading, analysis and solver time when it comes to creating a model or another output for a user.

Figures 7A, 7B:
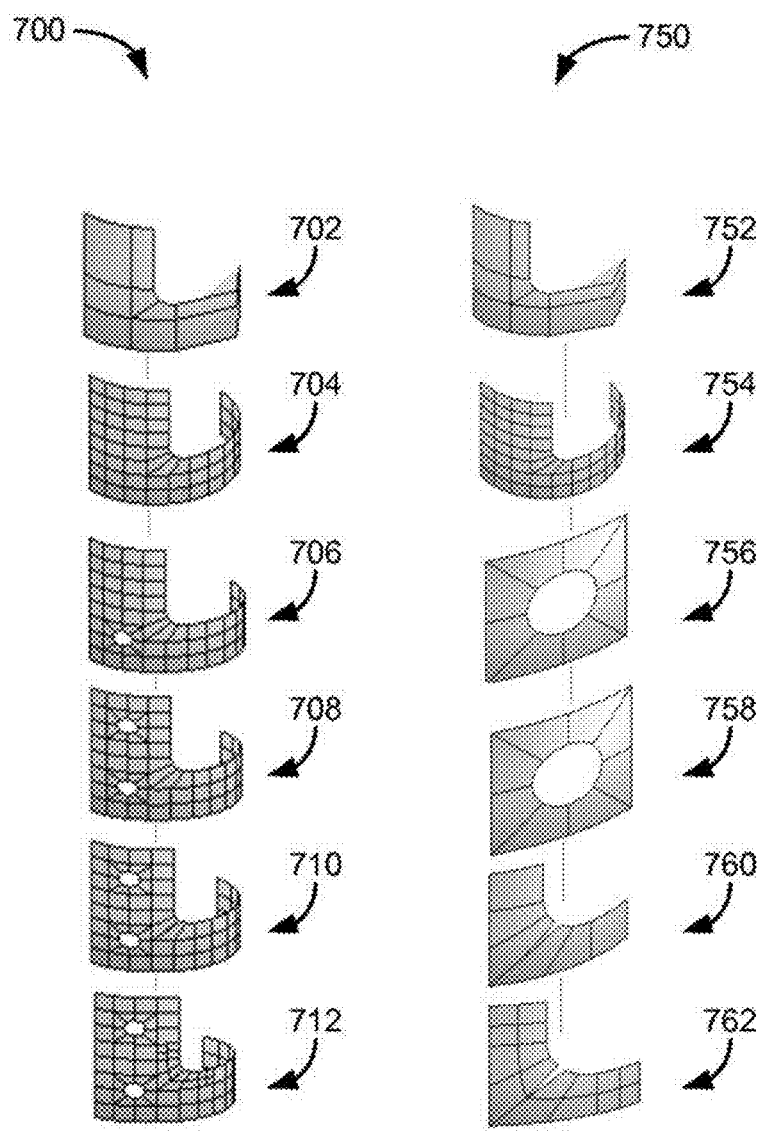
FIGS. 7A-B are examples of an inheritance tree for a model and components of a model, according to an exemplary embodiment.

Referring now to FIGS. 7A-7B, such a process is shown in greater detail. FIGS. 7A-7B illustrate inheritance trees for an object, in this case, a curved panel. In the inheritance trees of FIGS. 7A-7B, new models are derived from the base model whose data is inherited, overridden, and/or expanded. For example, if a user changes a model 702 to create model 704, the type of change is the inherited data. The derived model 704 establishes a link to the parent model 702 but what defines the derived model 704's own unique identity is the inherited data. Inherited data may include geometric mesh information, load conditions, boundary conditions, or whole solutions of analysis models. In other words, the derived model 704 has new characteristics that differ from model 702, which can be defined as a component.

Using such a structure allows for improved processing time and efficiency. When a user creates model 704 based on model 702, the computer program the user is using to create the model (or the rule-based suggestion engine, or inference engine) stores not the whole model but just the change between an earlier model and a later version of the earlier model. In one embodiment, the changed components of a model may be stored and solved instead of the complex model.

In FIG. 7A, a model view 700 of the curved panel that a user may be creating is shown in the form of an inheritance tree. In FIG. 7B, a corresponding component view 750 for the curved panel is shown in the form of an inheritance tree. In model view 700, the user may start by creating model 702, which has a coarse mesh. Then, in model 704, a fine mesh version of the model is created. In the corresponding component view for the model view, components 702, 704 are stored as components 752, 754 in the inheritance tree.

The user may then insert a hole to create model 706, changing the mesh or area around which the hole was inserted. In component view 750, instead of storing the entirety of model 706, the specific area that was changed (e.g., the component that changed) is stored as component 756. Therefore, when the model is provided to another module, such as inference engine 108 or the analysis module 510, instead of providing a whole model 706, information relating to component 756 is provided, reducing the amount of data provided to the module.

The user may then insert another hole to create model 708. In this example, the area around the hole that was changed may have been changed in exactly the same way as the area around the hole changed in the creation of model 706. Therefore, for component view 750, the component 758 to be created should be exactly the same as component 756. However, the computer system may realize that components 756, 758 are the same, and may avoid creating component 758, instead copying component 756. Component 758 is then inserted into the inheritance tree of component view 750.

Next, the user may insert a small tear or ripple into the model to create model 710. Instead of storing the whole model 710, in component view 750, only the immediate area around the small tear or ripple is stored as a component 760 in the inheritance tree. Next, the user may propagate the coarse mesh around the small tear or ripple into a more fine mesh to create model 712, and component 762 illustrating the propagation may be stored in the inheritance tree.

When the model created by the user is then provided to an inference engine 108 or to another module, instead of providing the various models that were created along the way, the inheritance tree containing all of the components may be transmitted instead. The components in the component view 750 that is transmitted to the inference engine is then used by the inference engine 108 to generate suggestions as generally described in FIGS. 1-6. Further, by providing the components instead of the whole model, it is possible to have parallel processing of the components. In one embodiment, as the user generates the model and system generates the respective components, the data regarding each component may be sent to the analysis module 510. In this embodiment, the analysis module may indicate to the user that one of the components may have a fault. Upon detection of a fault, the redesign generation module 514 may generate a redesign that meets the requirements of the knowledge base 106. Accordingly, the output module 516 may generate a suggested modification for the user for the component. Moreover, as each component is built it may be sent to the analysis module 510 sequentially or simultaneously.

In another embodiment, the data regarding the components may be sent to the analysis module 510 in parallel. The analysis may be performed on each component initially and the analysis may be assembled based on the component hierarchical tree. For example, components 752, 754, 756, 760 and 762 may be analyzed individually and then the results may be assembled based on each components order within the hierarchical tree.

Figures 8A, 8B:
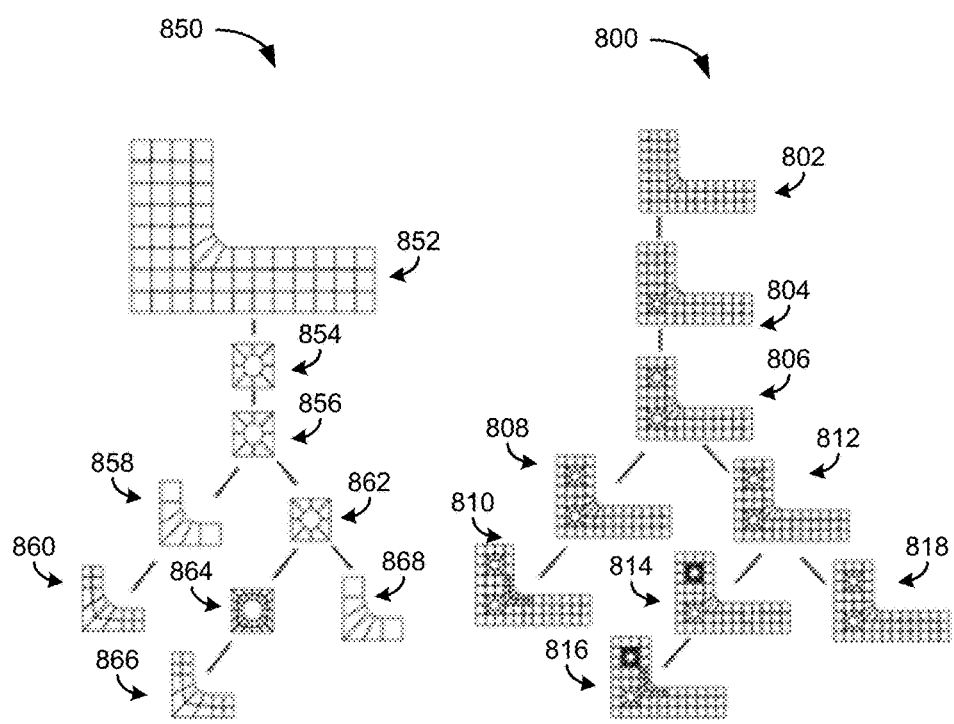
FIGS. 8A-B are examples of an inheritance tree for a model and components of a model, according to another exemplary embodiment.

The inheritance trees of FIGS. 7A-7B do not include branching. Referring now to FIGS. 8A-B, example inheritance trees are shown that include branching. FIG. 8A illustrates a model view 800 of a model in an inheritance tree, and FIG. 8B illustrates a component view 850 of a model in an inheritance tree. In FIGS. 8A-B, the model at each node in the inheritance tree is described in terms of all components along its model path. The model path may be defined as the shortest route which links the top-most model in the inheritance tree to the current model. For example, referring to model 816 of model view 800, the model path for the model may include models 802, 804, 806, 812, and 814. Thus, model 816 is a combination of its corresponding component 866 in component view 850 and the corresponding components of the other models (components 852, 854, 856, 862, and 864). Each specific model 802-816 in model view 800 is therefore represented as a component corresponding with the model 802-816 along with all components 850-866 that correspond with a model that is in the model path of the specific model. Each node in each tree is associated with a complete model. When the inheritance tree of component view 850 is provided to the inference engine or other modules, the model paths are provided as well, allowing the inference engine or other modules to piece together models for analysis as described in FIGS. 1-6.

Referring further to FIG. 8A, models 810, 816 and 818 are shown as nodes with no "children"; therefore, such models may be considered complete or final. In other words, these may be the final version of the models (or the latest version) and may be the models of interest to the inference engine 108. All models in model view 800 are associated with at least one of the models 810, 816, 818, according to an exemplary embodiment.

Using the inheritance trees of FIGS. 7-8, the sharing of data by models in the hierarchy is enhanced. This allows for global or local analysis where results from a global analysis of the model (e.g., the first model) are used to provide boundary conditions for the local model (e.g., a final version of the model). In one embodiment, global analysis may represent analyzing an assembly of components representing a model. In one embodiment, local analysis may be component level analysis of a single or a limited numbers of components that is less than a complete model. The inheritance tree may be traversed via recursive functions in order to implement such an analysis. The recursive functions allow the inference engine 108 to access data belonging to any model in the hierarchy, and allows tasks to be performed on one or more models in the hierarchy without modifying the object in general.

For each model in the inheritance tree, various information about the model may be stored and organized in various ways. For example, for each model in the inheritance tree, various conditions such as boundary conditions, loads, material properties, and other properties of the model may be stored; a list of components of the model may be stored, each with their own conditions; mesh information may be stored (e.g., element information, node information), etc.

Referring now to FIG. 9, a block diagram of a rule-based suggestion system 900 is shown, according to an exemplary embodiment. Compared to rule-based suggestion engine 100 of FIG. 1, engine 900 includes additional components for allowing the model hierarchies described in FIGS. 7-8 to be provided to the inference engine 108 for analysis instead of just the model. Inference engine 108 (or another module configured to perform the activities as generally described in FIGS. 1-6) and knowledge base 106 are as described above.

Interaction manager 902 (e.g., a user interface) may be configured to receive input and produce output to/from the user 102. User 102 may provide an input to interaction manager 902 relating to a design of a model. When interaction manager 902 receives the input from user 102, interaction manager 902 interacts with class interactors 904. Class interactors 904 is configured to receive a user's input (e.g., a modified model) and to update the model and component inheritance trees based on the modifications. Interaction manager 902 may then provide the updated inheritance trees to inference engine 108 for analysis.

System 900 further includes a rule engine 906. Rule engine 906 is connected to class libraries 908. Class libraries 908 may be configured to store information relating to inheritance trees for models and components. Class libraries 908 may store inheritance trees that were created based on previous knowledge of a model. For example, referring to FIGS. 7A-B, the inheritance trees shown may be stored in class libraries 908 as a reference based on the model being previously created by a manufacturer or user.

According to one exemplary embodiment, the inheritance trees stored in class libraries 908 may be created based on rules from knowledge base 106. For example, using rules relating to how a model is to be structures, class libraries 908 may determine an appropriate inheritance tree that includes a model path for the model that follows the rules of knowledge base 106.

Rule engine 906 is configured to receive data (e.g., inheritance trees) from class libraries 908 and to provide the data to inference engine 108 when needed.

Inference engine 108 may be configured to monitor user 102 using system 900. For example, when inference engine 108 receives an input from interaction manager 902 relating to a model user 102 is creating, inference engine 108 may, in addition to suggestions for different components to use for the model, suggestions for additions or other changes to the model.

Referring now to FIG. 10A, a flow chart of a process 1000 for using inheritance trees in the rule-based suggestion system of FIGS. 7-9 is shown, according to an exemplary embodiment. Process 1000 includes receiving a user input of a model from a user (step 1002) and a second input of a model from a user (step 1004). Process 1000 further includes determining the difference between the two models (step 1006). The determination may be made by an interaction manager or may be specified by a user.

Process 1000 further includes updating inheritance trees for the model and the components of the model (step 1008). The updating is described in greater detail in FIGS. 7-8. Process 1000 may repeat steps 1004-1008 as the user continues to create or edit the model. When the user is finished, the inheritance tree of the components of the model may be provided to an inference engine or other module for analysis (step 1010).

Referring now to FIG. 10B, a flow chart of a process 1020 for using the rule-based suggestion system of FIGS. 7-9 is shown, according to an exemplary embodiment. Process 1020 includes simulating a model with a plurality of components. (step 1022) and arranging the components in hierarchical graph to forms the model (step 1024). Process 1000 further includes generate redesign recommendations for a component based on redesign recommendation rules (step 1026).

Level of Detail and Level of Abstraction

Figure 11:
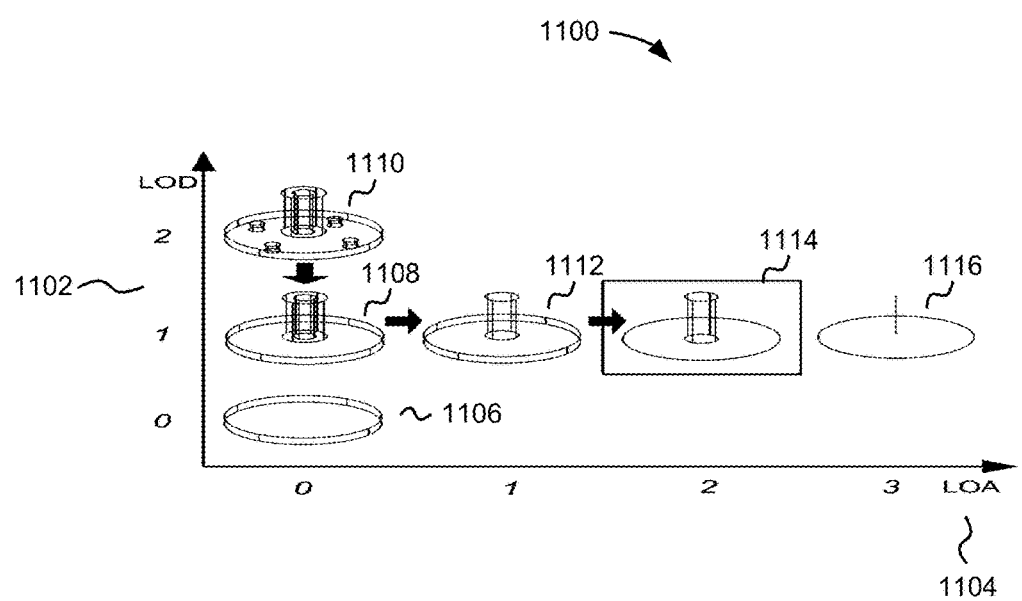
FIG. 11 is a diagram illustrating varying levels of detail and levels of abstraction for a model, according to an exemplary embodiment.

As a user is creating a model as described above, the user may wish to see a specific level of detail or level of abstraction when designing the model. Referring now to FIG. 11, a diagram 1100 featuring a model with varying levels of detail and abstraction is shown, according to an exemplary embodiment.

A user may wish to see a specific level of detail and a specific level of abstraction when designing a model. The level of detail (LOD) may refer to how many components of the model are visible to a user during creation or modification of the model. In other words, the user can use the level of detail to determined how much detail to render on the computer program displaying the model. For example, on axis 1102 in diagram 1100, level 0 is the most basic level, illustrating a model 1106 as just a disc. Level 1 illustrates a model 1108 as the disc with a rod, and level 2 illustrates a model 1110 as the disc with a rod and screws. A higher level of detail corresponds with more components of the model being shown. It should be understood that all components are actually party of the model, but may or may not be displayed based on the LOD set by the user.

The level of abstraction (LOA) may refer to how many features of the components of the model are shown during creation or modification of the model. For example, on axis 1104 in diagram 1100, level 0 is the most complex level, illustrating a model 1106 where the disc and rod are very detailed. Level 1 illustrates a model 1112 with a little less detail, level 2 illustrates a model 1114 with even less detail, and level 3 illustrates a model 1116 with the least amount of detail possible. It should be understood that any combination of LOD and LOA may be specified by a user, and that the number of LODs and LOAs may vary according to various embodiments. In FIG. 11, the user is shown as selecting a LOD of 1 and a LOA of 2.

Figure 12:
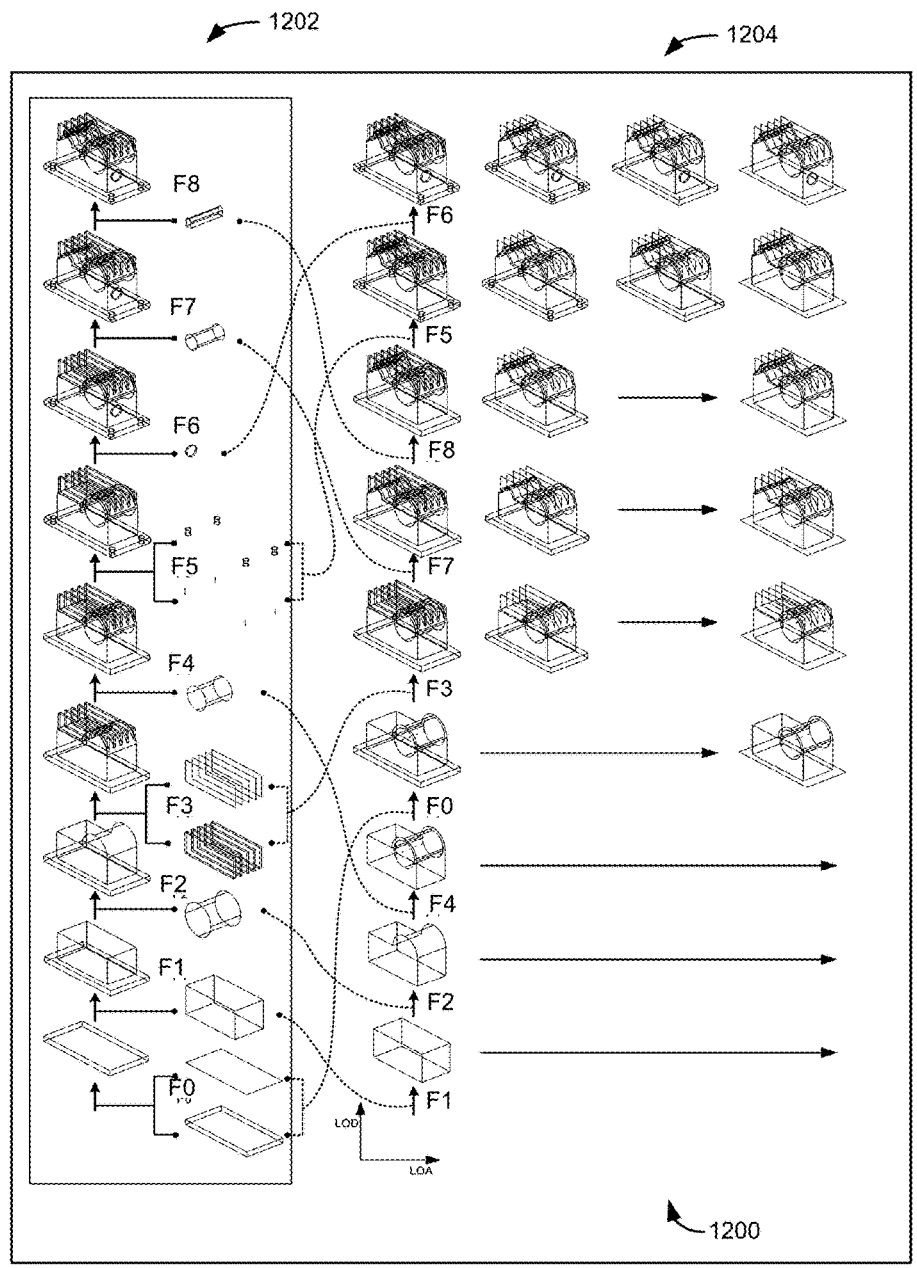
FIG. 12 is a diagram illustrating varying levels of detail and levels of abstraction for a model, according to another exemplary embodiment.

Referring now to FIG. 12, another diagram 1200 illustrating various LODs and LOAs for a model is shown, according to an exemplary embodiment. Diagram 1200 combines the use of different LODs and LOAs with the model view and component view as described in FIGS. 7-8. Diagram 1200 represents a possible collection of views to provide to a user. The user, upon selection of a LOD and LOA, may be provided one of the views illustrated in diagram 1200.

Referring to portion 1202 of diagram 1200, a model view is shown. The model view in portion 1202 is a view of the complete model instead of a view of the various components that make up the model. Referring to portion 1204, component views of the model are shown. The component views in portion 1204, in general, may contain a lower LOA than the model views, according to one embodiment. In particular, diagram 1200 shows the order in which components F0 to F8 were assembled in model view 1202 by the user. Since each one of these components may represent a different level of abstraction a dotted line is shown to the user to allow the user to see visualize the relation between the component view and the model view. As illustrated in diagram 1200 the model view 1202 and the component view 1204 may not introduce each component at the same level.

Figure 13:
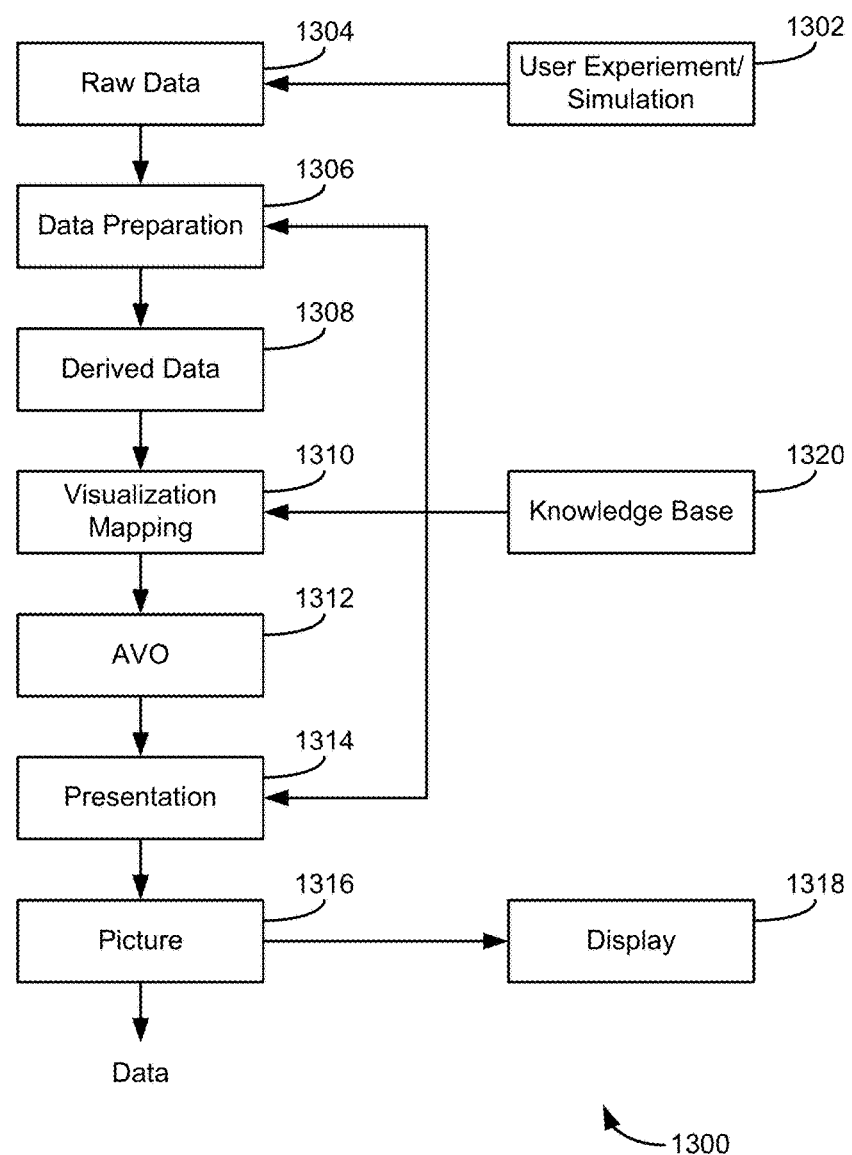
FIG. 13 is a data flow diagram of post-processing activities, according to an exemplary embodiment.

Referring now to FIG. 13, a data flow diagram 1300 of post-processing activities of the present disclosure is shown, according to an exemplary embodiment. The post-processing activities of FIG. 13 may be executed by, for example, the inference engine 108.

After experimentation and simulation of an object or model at block 1302, raw data describing the performance of the object is generated at a block 1304. The raw data is then prepared for derivation or analysis at block 1306. At block 1306, knowledge base data is received (e.g., rules relating to allowable limits or other values that the raw data should be compared against) from the knowledge base 1320. Using the data from knowledge base 1320, derived data may be calculated or determined at block 1308.

The derived data at block 1308 is provided to block 1310 for visualization mapping. At block 1310, data is received from knowledge base 1320 relating to how to display the model based on the derived data. Using the data from knowledge base 1320 and derived data from block 1308, block 1310 is used to generate an audio and visual output (AVO) at block 1312.

This AVO is presented to a user at block 1314. Block 1314 may further receive data from knowledge base 1320 relating to the display of the model the AVO is based on. Block 1314 is configured to generate a picture using the AVO and data from knowledge base 1320 and provide the picture at block 1316. The picture is then provided to a display 1318, and data relating to the picture, model, or any step of the post-processing may be provided to another system or module.

Feature Recognition

The systems and methods described with reference to FIGS. 1-13 describe a rule-based suggestion engine to implement artificial intelligence with respect to design modifications. Another features of the rule-based suggestion engine 100 may be feature recognition, identifying similar parts and suggesting replacement parts for the identified similar parts. For an object being rendered by a user, rule-based suggestion engine 100 may determine if a part of the object being rendered is similar to other parts (e.g., parts stored by a knowledge base 106 as described above). Various object parameters such as the number of sides, shapes, surface or volumetric features, or other information may be used in the feature recognition system. Further, the connections between multiple parts may be used to identify similar parts, a naming convention for the part may be used to identify related parts, etc.

Features may be important in the manufacturing context as features capture higher level engineering context of a part of an object. Features may provide a way of capturing design intent for an object, alleviate construction procedures for the object, and allow a user to reason at a high level of abstraction than that provided by geometric and topological entities.

Features contain geometric and topological information for a part and represents high-level entities useful in part analysis as described below. The feature may more generally represent functionality of a part, a region of the part, a region of the part that matches or connects with a corresponding feature on another part, etc.

The feature recognition system of the present disclosure may include a defeaturing process. For example, referring now to FIGS. 14A-C, defeaturing of a part is shown in greater detail. In FIG. 14A, an object 1400 is shown with various features. Part 1402 of object 1400 is shown with two features (a hole and a pocket). The surface features 1404 and the volumetric features 1406 of the hole and pocket are also shown in FIG. 14A.

A user may render the object shown in FIG. 14A and surface features 1404 and volumetric features 1406 may be learned by the feature recognition system. A defeaturing process using the feature recognition system of the present disclosure may be used on the surface features and volumetric features to learn the features of a part, set of parts or object. For example, referring to illustrations 1420 of FIG. 14B, example features are shown that may be checked against surface features 1404 and volumetric features 1406. For example, based on the shape of features 1404, 1406, the feature recognition system may check them against, for example, a blind hole feature 1422, through hole feature 1424, close through pocket feature 1426, blind pocket feature 1428, cylinder boss feature 1430, and rectangle boss feature 1432.

The features of FIG. 14B relate to the recognition of extrusions and protrusion features. The feature recognition system is configured to detect various features, such as but not limited to, extrusions and protrusions. Referring to illustrations 1440 of FIG. 14C, the feature recognition system may further check the overall geometric shape of, for example, features 1404, 1406. The feature recognition system may check them against, shapes, such as but not limited to, a wedge shape 1442, a T-slot shape 1444, a step shape 1446, a notch shape 1448, a partial cylinder shape 1450, and a sector shape 1452.

Figure 15:
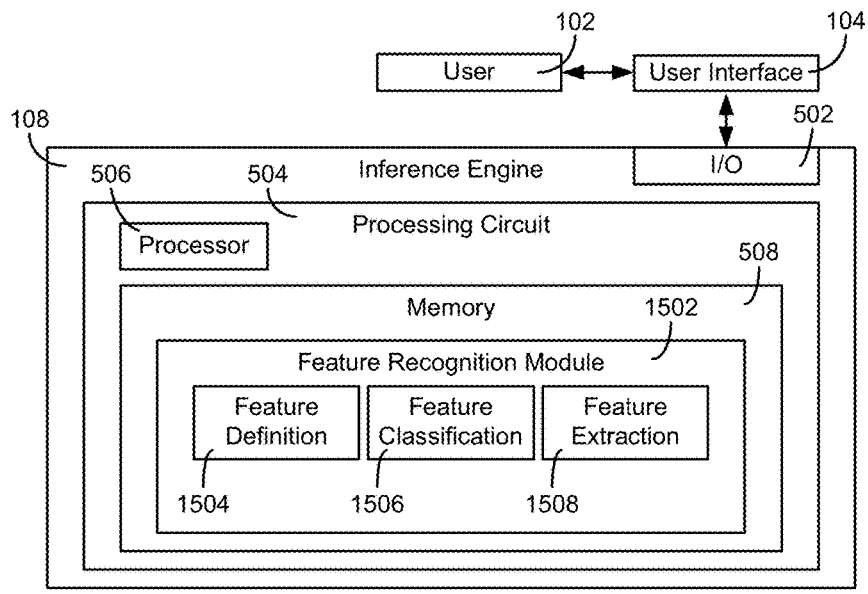
FIG. 15 is a block diagram of a feature recognition module of the inference engine of FIG. 1, according to an exemplary embodiment.

Referring now to FIG. 15, a block diagram of inference engine 108 including a feature recognition module 1502 is shown, according to an exemplary embodiment. While feature recognition module 1502 is shown as part of inference engine 108 in the embodiment of FIG. 15, it should be understood that in other embodiments, the feature recognition module and feature recognition activities of the present disclosure may be executed in other components of rule-based suggestion engine 100. Feature recognition module 1502 may receive a user 102 input via user interface 104 and I/O interface 502.

Feature recognition module 1502 may be configured to recognize patterns of geometric parts or a plurality of parts, the engineering functionality or goal of an object or part of an object, the other parts or assemblies that the part is connected to. Feature recognition module 1502 may further identify geometric and topological instances, which belong to a feature instance from a geometric model of an object, and extract parameter information. Parametric information may be various properties of an object. For example, a hole in a solid object may have various parameters, such as but not limited to, radius, name, diameter, depth, limit, offset, color, direction, angle, etc. Feature recognition module 1502 may extract information relevant to a different domain than the one in which the design of the object was made. The domain of an object may be for example the industry in which that part is commonly used. For example, there may be a car domain or an airplane domain. In order to recognize the similarity of a part the system may determine which other parts are connected to the part for which the similar part is being search. For example, if a part is connected to a car door then another part which matches the physical properties of the part of interest, may be rejected as being similar because the matching part is connected to a jet engine because a card door is not similar to a jet engine.

Accordingly, the similarity of parts may be determined based on the similar properties of two parts, commonality in the part's names, and the other parts or assemblies that a part connects to.

Feature recognition module 1502 may include a feature definition module 1504, feature classification module 1506, and a feature extraction module 1508 for completing the feature recognition process. Feature definition module 1504 may include rules for feature recognition. The features of the object to be recognized may be precisely defined using feature definition module 1504. Each instance of a feature in the object may be identified. The definition of the features may include determining a minimal set of necessary conditions to classify the feature uniquely. Feature classification module 1506 may classify the potential features based on the feature definitions. Each feature has its own definition (i.e a chamfer's definition can include an angle, color name, length, etc). Feature extraction module 1508 may extract features of the object or model, and store the features for further analysis. Feature extraction module 1508 may identify features based on the pre-specified rules of feature definition module 1504.

Referring further to feature definition module 1504, the feature definition rules may relate to, for example, boundary elements of the object or part of the object such as faces, edges, loops, and vertices. Feature definition rules may further relate to constraint operators that specify the types of relationships the object or part should have with other features, objects, or parts. For example, constraint operators include parallel, perpendicular, adjacent, equal, concave, convex, and other relationships or conditions between the features. The rules of the feature definition module 1504 may be used for a solid model of an object or part of an object as long as the rules are interpretable by the feature recognition module 1502 and a search technique is used to match the model to the rules.

Figure 16:
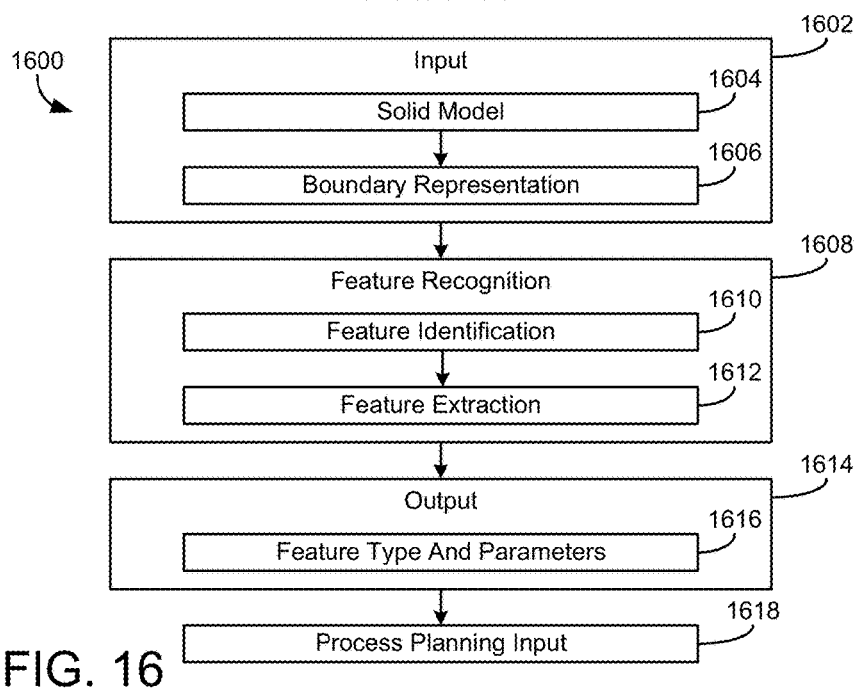
FIG. 16 is a flow chart of a process for feature recognition, according to an exemplary embodiment.

Referring now to FIG. 16, a flow chart of a process 1600 for feature recognition is shown, according to an exemplary embodiment. Process 1600 may include but is not limited to, an input step 1602 where the user provides a solid model of an object, a feature recognition step 1608 where the feature recognition algorithm may be executed, and an output step 1614 where the recognized feature and the corresponding results are used for process planning as generally described in FIGS. 1-13 and suggest possible replacement parts for the solid model.

Process 1600 includes receiving a solid model input (step 1604) and boundary representation information (step 1606) at input step 1602. A user may provide the inputs of steps 1602-1606 as generally described in the present disclosure.

Process 1600 further includes feature identification at step 1610. Step 1610 may include identifying features of the solid model based on the feature definition rules of the feature definition module 1504, for example. After the features are identified, feature types and parameters are extracted (step 1612) and provided to the output step 1614. The feature types and parameters are collected at step 1616 and provided to a process planning input (step 1618) as described with reference to FIGS. 1-13.

Referring now to FIGS. 18A-D, examples of the feature recognition process 1600 are shown, according to various exemplary embodiments. Some examples of features of a part or object may include the total number of faces of the object (TNOF), the type of faces (e.g., the shape, curve, or plane) (TOF), the total number of edges (TNOE), and an attribute such as a protrusion or depression (P/D). Referring generally to FIGS. 18A-D, the example feature recognition processes shown include recognition of TNOF, TOF, TNOE, and P/D; it should be appreciated that the processes described herein may be adapted for any other type of feature. The example processes of FIGS. 18A-D may be used to swap out parts or objects created by the user with a new list of parts (e.g., to improve performance or cost).

The feature recognition process may include counting the TNOF and TNOE of the part, checking for P/Ds of the feature, and then identifying the feature type (corresponding with steps 1610, 1612 of process 1600). For example, referring to step 1610 of process 1600, the feature identification step may first include counting the TNOF and TNOE for a feature. If the feature can not be identified using just the TNOF and TNOE, then the process may check the TOF or the P/Ds. In other words, the process may include checking more and more attributes of the feature until the feature can be identified. Referring to FIG. 17, pseudocode 1700 illustrates an example implementation of the process. For example, the type of face of the feature may be determined, then other feature identification steps may be taken based on the type of face (e.g., identifying TNOE, P/D, etc.). If further identification is needed, an external access direction (EAD) may be checked by checking the direction of the faces, for example. Then, a point coordinate associated with the feature may be determined. It should be understood that pseudocode 1700 and the steps contained therein are provided by way of example only.

Figures 18A, 18B:
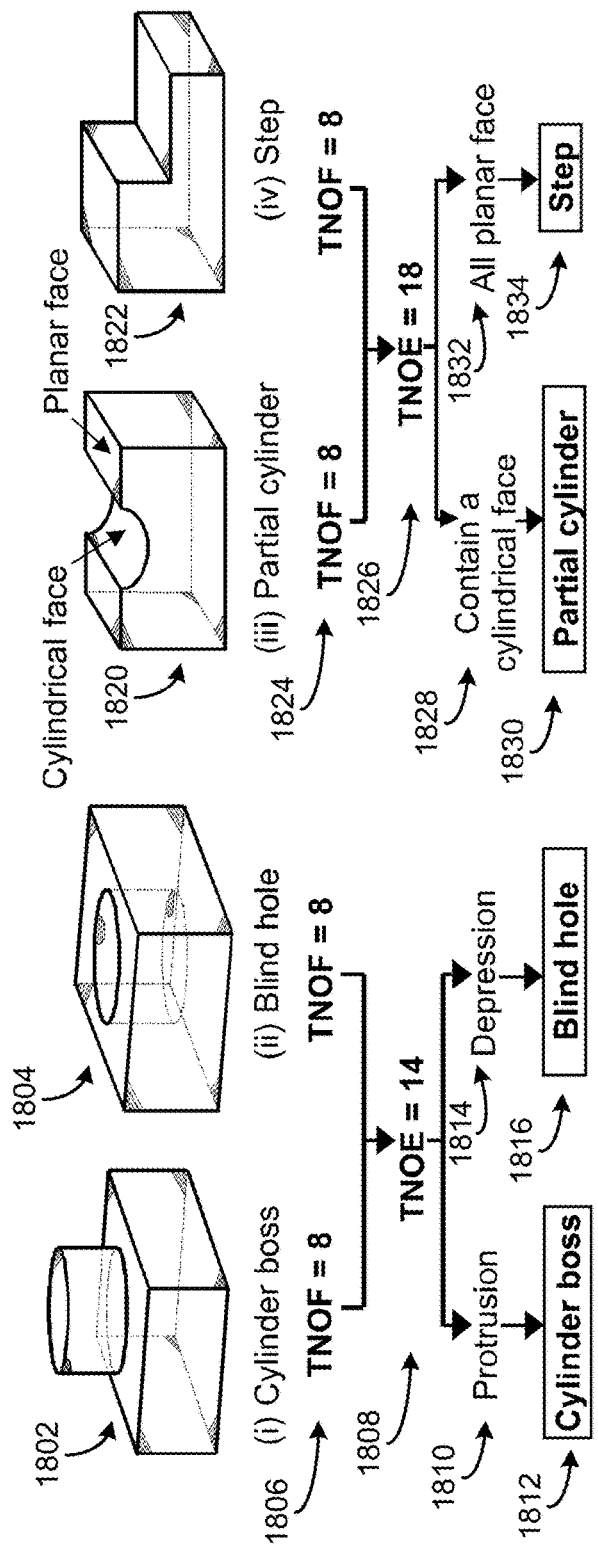

Referring now to FIG. 18A, the process is shown identifying a cylinder boss 1802 and blind hole 1804. Both cylinder boss feature 1802 and blind hole feature 1804 may have a TNOF of 8 and a TNOE of 14 (steps 1806-1808). Further, the process may determine that the TOF of the two features are the same (e.g., seven planar faces and one cylindrical face). Since both features have the same TNOF, TNOE, and TOF, the process may then check for protrusions or depressions, since the process cannot determine the identity of the feature based solely on the TNOF and TNOE. Upon detection of a protrusion, it may be determined that the feature is a cylinder boss (steps 1810, 1812), and upon detection of a depression, it may be determined that the feature is a blind hole (step 1814, 1816). In order to determine a protrusion or a depression, the system can use the depression's direction or angle to determine if the angle is below the face of the surface or above the face of the surface.

Referring now to FIG. 18B, the process is shown identifying a partial cylinder 1820 and a step 1822. Both features 1820, and 1822 may have a TNOF of 8 and TNOE of 18 (steps 1824, 1826); therefore, the process cannot determine the identity of the features based solely on the TNOE and TNOE. However, the process can check the TOF of features 1820, 1822. At step 1828, the cylindrical face of feature 1820 may be identified, and the feature may be identified as a partial cylinder at step 1830 as a result. Similarly, at step 1832, it may be determined that all the faces of feature 1822 are planar; therefore, the feature may be identified as a step feature at step 1834.

Referring now to FIG. 18C, the process is shown identifying a through hole 1840. The process may determine the TNOF (7) and TNOE (14) of feature 1840 (steps 1842, 1844). The process may determine that the TNOF and TNOE count is unique to through holes; therefore, the process may identify the feature as a through hole at step 1846 based solely on the TNOF and TNOE.

Referring now to FIG. 18D, the process is shown identifying a sector 1850 and wedge 1852. Features 1850, 1852 may have the same TNOF of 7 and TNOE of 15 (steps 1854, 1856); therefore, the process cannot determine the identity of the features based solely on the TNOE and TNOE. However, the process can check the TOF of features 1850, 1852. At step 1858, the cylindrical face of feature 1850 may be identified, and the feature may be identified as a sector feature at step 1860 as a result. Similarly, at step 1862, it may be determined that all the faces of feature 1852 are planar; therefore, the feature may be identified as a wedge feature at step 1864.

Semantic Approach for Part Identification

In addition to the feature and information mapping described with reference to FIGS. 14-18, a semantic approach may also be used for geometry and object part identification. To use a semantic approach, data models of the connected geometry-topology may be described semantically (i.e., geometry-topological-specific ontologies can be defined). Then, the data is described in the semantic environment, and all the semantic mapping and data modification features may be made available in the rule-based suggestion engine. Mapping between different software applications can be done between the geometry-specific ontologies, or they can be mapped by using domain-specific ontologies to simplify the mapping between different domain ontologies and the geometry/parts level. In other words, the feature recognition process of FIGS. 14-18 may be improved by providing semantic-based suggestions as generally described in FIGS. 1-13.

The semantic approach may be applied to modeling time data management and data transfer between applications and components (e.g., applied when a user is creating an object using the rule-based suggestion engine of the present disclosure). In addition to sending and receiving data when data is modified by a user, it may be further required that an order of precedence (i.e., which of the software components has the highest priority, which applications should follow the orders, etc.) be defined. This way, rules and constraints are applied to the objects and parts created by the user.

To apply these rules and constraints, semantic reasoning and rule-based modeling concepts may be applied to narrow down the options for the user. Semantic reasoning may generally refer to checking the validity of the semantic data on the basis of the ontologies, or the implicit inferring of new information on the basis of existing data. As an example, validity checking of the system model based on the ontology definition and possible additional modeling case restrictions may be performed (e.g., checking a created object against the rules and constraints already defined). Rule-based modeling concepts may generally refer to checking object features defined by the user. As an example, an analysis of system features based on modeling data and additional instructions about a feature under analysis may be performed (e.g., checking features of a created object against object rules and constraints).

Figure 19:
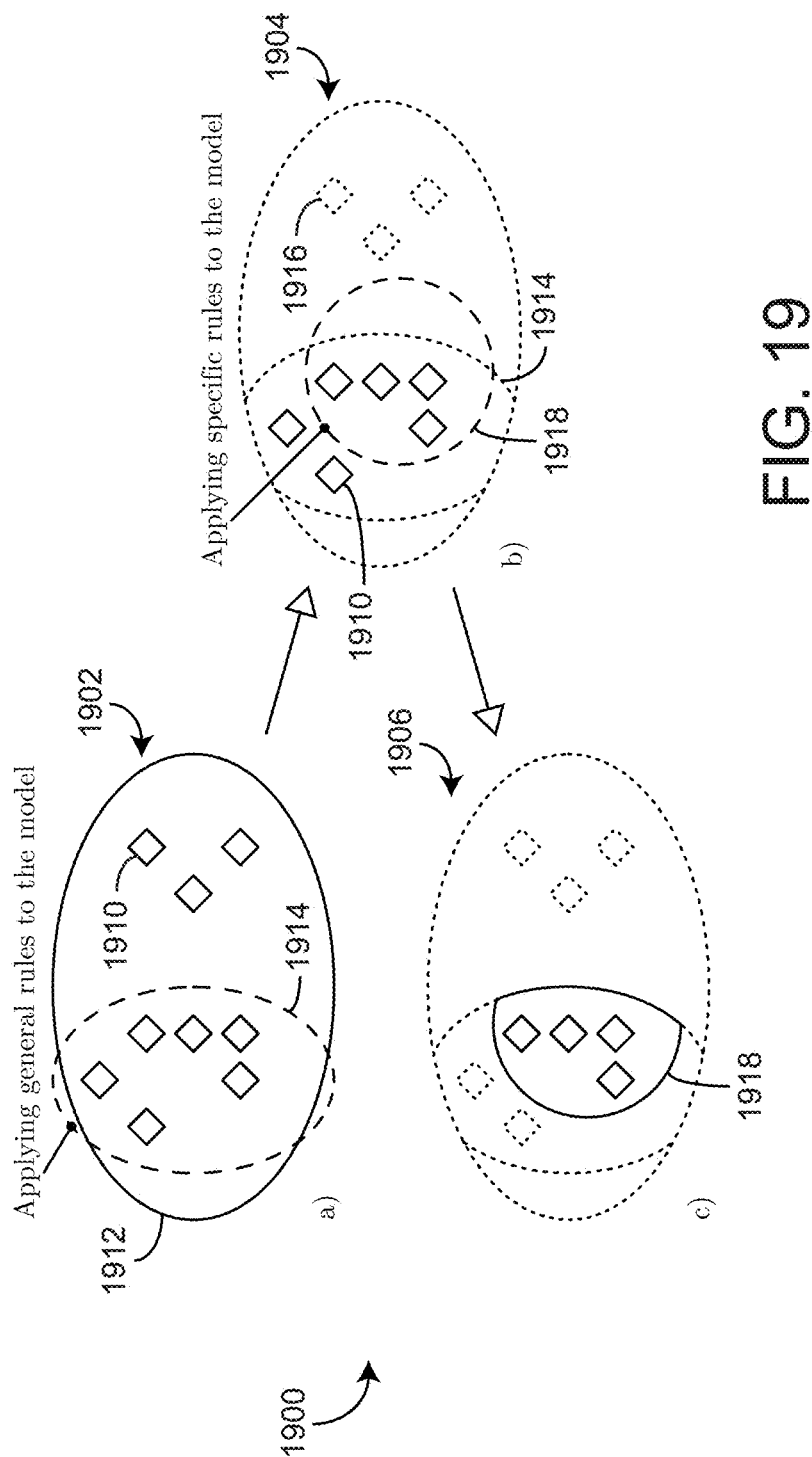
FIG. 19 is an illustration of a process of applying semantic rules and constraints to a modeling process, according to an exemplary embodiment.

Referring now to FIG. 19, an illustration of a process 1900 of applying semantic rules and constraints to a modeling process is shown, according to an exemplary embodiment. At step 1902, at the beginning of a modeling task, the entire ontology space and all parameter values may be open for use by a user. There may be multiple parameter options 1910 available to the user within the parameter space 1912 (represented by the diamonds and the oval grouping the diamonds).

Selecting a domain ontology (e.g., a system modeling ontology) may define the number of parameter options 1910 based on general modeling rules and corresponding constraints. By applying rules 1914 to the set of parameter options 1910, some of parameter options 1910 are discarded. At step 1904, dashed parameter options 1916 are discarded while the other parameter options that fit rules 1914 remain. Next, case-specific rules and constraints may be applied. This further bounds the number of parameter options 1910. At step 1906, the design space for the current task (e.g., object) is defined based on the specific rules 1918.

The modeling tools infer the semantic model during the process shown in FIG. 19 and limit the available options for the user. This decreases the possibility of error and makes it easier for the modeler (e.g., the user) to use the modeling tools with fewer options, thus increasing efficiency of the modeler work. The advantage of using semantic rules and constraints with reasoning simplifies the multi-domain modeling and data management. This is because the same data management and rule definition mechanisms may be used for all the modeling data. By using the semantic method described herein, instead of creating model validation mechanisms and validation rules in the modeling tool, the validation mechanisms and rules are included in the modeling domain ontology (for generic domain rules) and individual simulation model (for case specific rules). This enables the use of strict rules and combines the model information with information about the validity of the model. The expansion in information also increases the value of the data. It converges the product modeling data into information.

Figure 20:
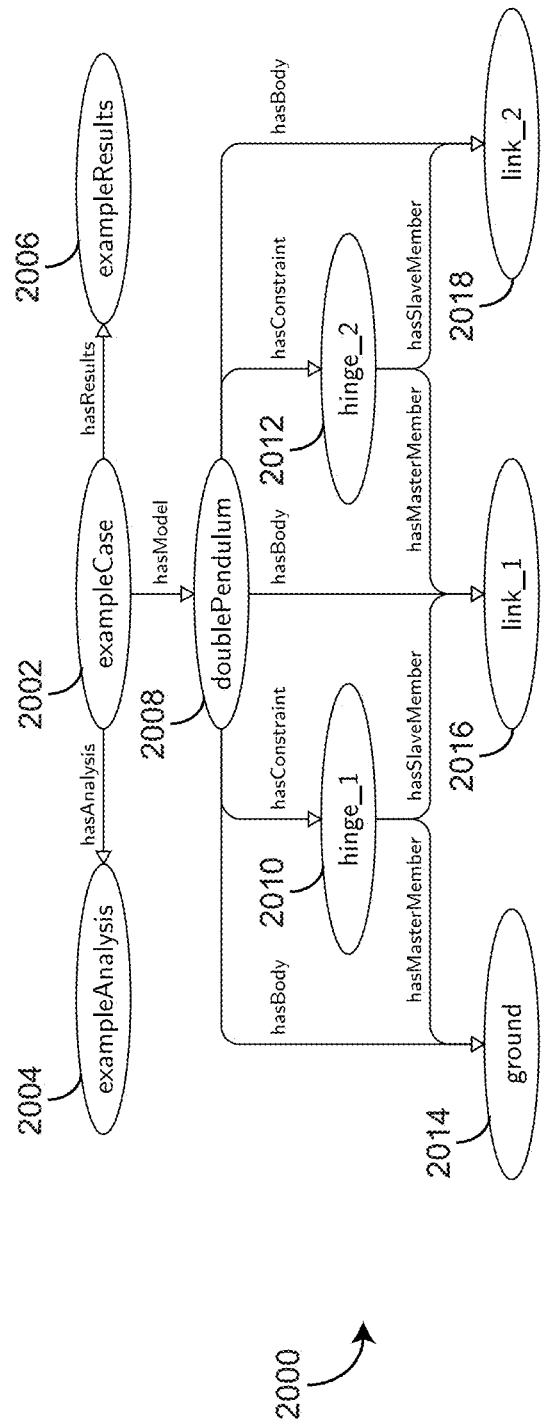
FIG. 20 is a flow chart of a process of applying semantic rules and constraints to a modeling process, according to an exemplary embodiment.

Referring now to FIG. 20, a flow chart of a process 2000 of applying semantic rules and constraints to a modeling process is shown, according to an exemplary embodiment. Example process 2000 illustrates applying rules and constraints for a double pendulum object. The user may create an object "exampleCase" at step 2002, which can be analyzed at step 2004 and for which results are generated at step 2006. At step 2008, the object is determined to be a double pendulum.

In the embodiment of FIG. 20, only simple rules for mass and the mass moment of inertia components of the double pendulum are set. In another embodiment, process 2000 may be used to, for example, set boundaries for geometrical dimensions of the double pendulum. In process 2000, constraints and the body of the double pendulum are defined. The defined constraints result in the hinges being defined at steps 2010, 2012. The defined body results in the ground and links defined at steps 2014, and 2016. Further, the hinges may be defined (a master member and slave member of the hinges) and connected to the ground and links in the double pendulum model.

Modeling case-specific rules can be used for bounding the modeling design space tighter than what the general modeling rules do (e.g., going from step 1904 to 1906 compared to going from step 1902 to 1904). As the general rules may be defined to be used for checking the model validity against general domain modeling principles, the modeling case-specific rules may restrict some physically meaningful features, such as a maximum value for the body mass or the number of individual bodies in the model. Modeling case-specific rules can be defined separately from the main ontology, or they can be applied during the case modeling. The flexibility to add rule sets on the data allows the design of special rule sets to be used as stencils to check the model against the requirements. Referring now to FIG. 21, a table 2100 of the double pendulum from FIG. 19 is shown, illustrating case-specific rules applied to the double pendulum.

New Part Suggestion

As discussed above with respect to FIGS. 1-21, the system is configured to determine the similarity between a plurality of parts and/or assemblies. The identification of similar parts allows the system to suggest a substitute part for similar parts where the substitute part meeting pre-specified desired physical properties or attributes. A user may specify the physical property requirements that are desired from a user created simulated part. In one implementation, the system may determine which other already optimized parts meet those desired properties and which parts are similar enough to the user created part to be an appropriate substitute. The desired properties can include strength, weight, length, width, etc. The desired properties may be goals that are being pursued by the user for the part.

The system may generate a plurality of design paths that show the user the most optimal options to reach a set of desired goals or properties. The choices made by other users can also be likewise understood and the relationship between choices and improvements (progress towards goals) can be learned by the system and presented to other user's as choices and possible outcomes. From the paths, the system can search for and deduce the optimal routes and present the user with the most probable outcomes. When the user improves upon the suggested results, the system can learn from the improvement by storing the results of the improvements that were achieved or whether the user abandoned the changes. The system may be further be configured to identify the non-useful options that are attempted and rejected by the users. The system also notes the options that are pursued and help the users reach their goals, options that are not pursued and the options that are pursed and found to produce results that do not further the user's goals.

The system may learn from a group of users as the system recognizes that one or more users could have created a different and likely better results. The system is configured to determine which engineering choices are the best based on the similarity of components, identification of goals and relationships between goals and identification of the most successful design path to reach the desired goals. In terms of users this leads to identifying the paths that are best, and the users that most often take the best paths are most talented users, and in terms of optimizing then we can take the composite (which is the best path generally) or we could mimic the best user. Alternatively, the system may suggest the shortest path to the user desired goals. We can also determine the design iterations that did not lead towards the goals in that they did not improve any of the goals or severely unbalanced goals.

In another embodiment, a user may design a part to have a set of physical properties. The user may request that the system search for other previously designed parts that are similar and have a similar set of physical properties. The system may determine based on versioning what changes were made to reach the set of physical properties. The system may determine which one or more of the choices presented is combinable and generate a new choice based on the combination of one or more of the previously designed parts. Determining whether one or more choices is combinable may be based on the property that were modified to achieve the set of physical properties. For example, in one part the material may have been changed to achieve increased strength and in another part the shape of the part was changed to achieve increased strength. In the above example, the two features of changing the material and changing the shape of the part may be combinable to generate a part with greater strength then both the original parts.

Figure 22:
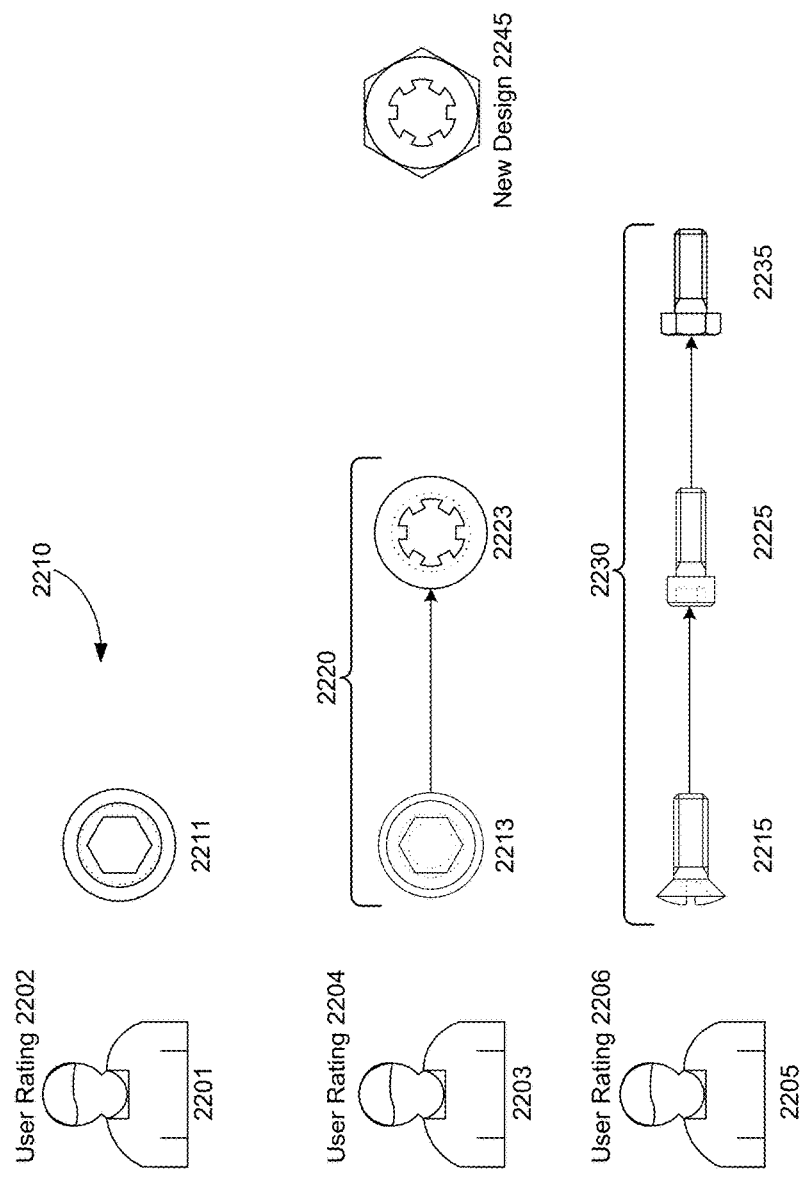
FIG. 22 illustrates design paths that example users may take when designing a physical object in a CAD environment.

FIG. 22 illustrates design paths that example users may take when designing a physical object in a CAD environment. In particular, the systems discussed above may be configured to display the design paths of various users. As shown in FIG. 22, the ratings associated with each user may be displayed adjacent to the user's image. Alternatively, the user may be identified by their name or a username.

FIG. 22 shows example design paths 2210, 2220, and 2230 of three users 2201, 2203, and 2205 when the users designed the head of a fastener. User ratings 2202, 2204, and 2206 can be displayed when the design paths are shown. The user ratings may be based on various criteria, such as but not limited to a 5 star system, points out of hundred, combined with the number of other users that provided a rating of the user. The user ratings may be displayed adjacent to or within the image of the user. The user rating may be based on the other user's opinion of a user. Alternatively, the user rating may be based on the ratings of the designs that were generated by the user. In an example embodiment, the user rating 2202 may be 3 out of 5 stars and the user 2201 went through the design path 2210 which include a single design 2211 (i.e. hex-bevel set top). Adjacent to the image of the design 2211 the system may display the physical properties of the design, such as the amount of torque this particular fastener can handle.

User 2203 may have a rating 2204 and may have traversed the design path 2220 that includes two designs, design 2213 (i.e. fluted set top) which was modified by the user 2203 to create design 2223 (i.e. fluted set top). Adjacent to each design 2213 and 2223 the system may display the physical propertied that were changed. Moreover, as the user is modifying these designs the system records in a knowledge database the types of changes that were made to achieve an improvement in a particular physical property. For example, the groves created in the central portion of design 2223 may have allowed a user to increase the torque that can be applied on the set top. Accordingly, if another user wants to increase the torque handling capabilities of a similar part, the system may suggest inserting groves into the center portion just like design 2223.

Another user 2205 may have a rating 2206 and may have followed design path 2230 which includes three designs 2215, 2225, and 2235. The user may have initially created design 2215 (i.e. countersunk) and then modified design 2215 to create design 2225 (i.e. hex socket). If the user continued optimizing, then the user may reach design 2235 (i.e. hex head). The design 2235 has a hexagonal shaped circumference. Based on design paths 2220 and 2230 the learning logic 412 may determine that inserting teeth at the center or putting a hex shaped exterior may be used to increase the amount of torque the fastener can handle or maximize the failure torque. Accordingly, when another user wishes to maximize the failure torque of a fastener, the learning logic 412 working with the redesign generation module 512 may generate a design that combines the changed features of design 2223 and design 2235 and present the resulting design to the user. With the new design 2245, the system may also extrapolate based on the results from design 2223 and design 2235 what the resulting maximum torque handling capability is.

Figure 23:
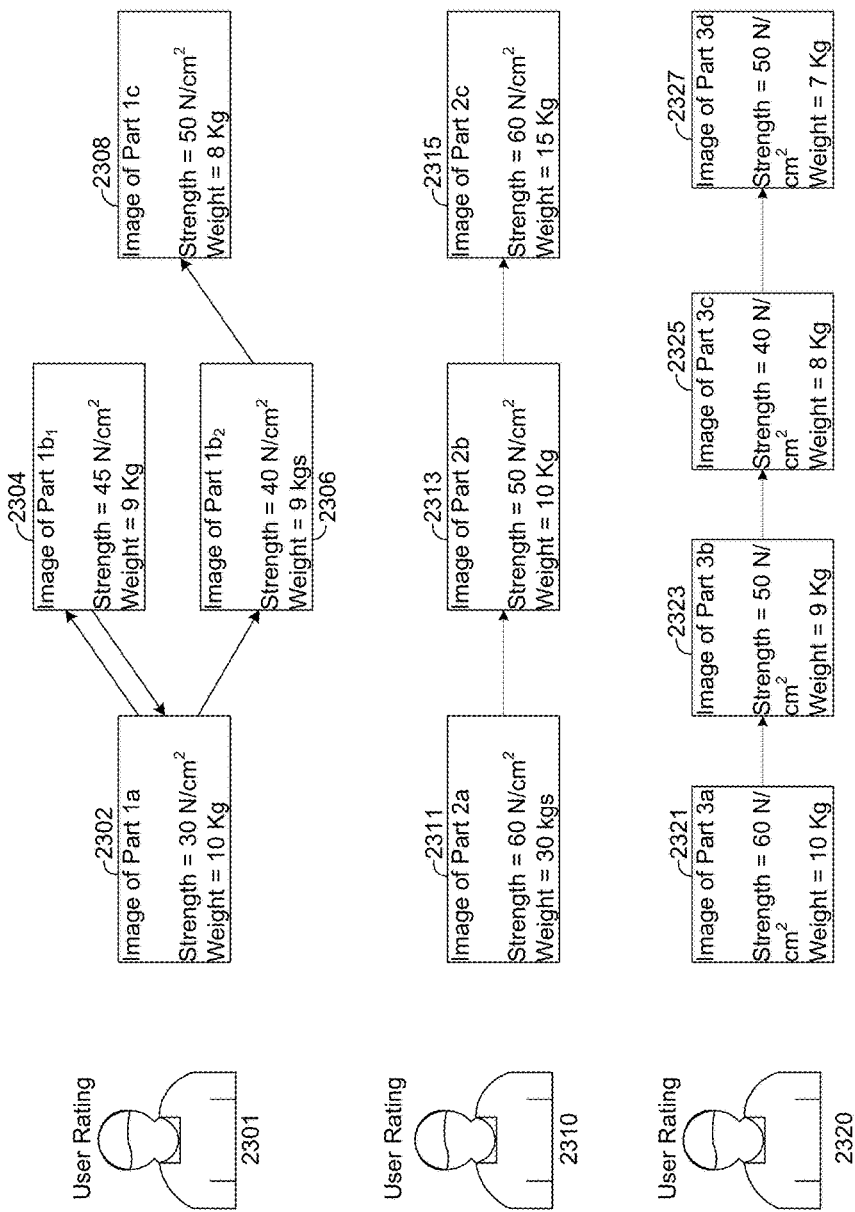
FIG. 23 shows design paths that some users may create when simulating a physical object in a CAD environment.

FIG. 23 shows design paths that some users may create when simulating a physical object in a CAD environment. In particular, the systems discussed above may be configured to display the design paths of various users. As shown in FIG. 23, the ratings associated with each user may be displayed adjacent to the user's image. Alternatively, the user may be identified by their name or a username.

The design path taken by user 2301 may include a plurality of designs. The user 2301 may design a part that is intended to have a particular strength and weight. On many occasions part designers may want to increase the strength of a part, while reducing the weight of the part. User 2301 may begin by designing part 1a at step 2302 and the physical properties of part 1a may be shown as well. For example, part 1a may have a strength of 30 Newton per centimeter squared and part 1a may weigh 10 kilograms. At step 2304, the user 2301 may modify part 1a and create part 1b$_1$ such that the strength of part 1b$_1$ (45 Newton per centimeter squared) is greater than the strength of part 1a while reducing the weight to 9 kilograms. The user 2301 may attempt to further optimize part 1b$_1$, but the user may determine that the part 1b$_1$ cannot be further optimized by this user or part 1b$_1$ is a dead end. The user may decide to go back to part 1a and take a different direction such as part 1b$_2$. At step 2306, the user may generate a design for part 1b$_1$ which exhibits better strength than part 1a but less than part 1b$_1$ and has the same weight has part. 1b$_1$. The user may continue to optimize part 1b$_2$. At step 2308 the user may modify part 1b$_2$ to create part 1c which exhibits a strength of 50 N/cm$^2$ and weight 8 kilograms.

The design path taken by user 2310 may include a plurality of designs. The user 2310 may design a part that is intended to optimize strength and weight just like user 2301. Both users 2301 and 2310 may be designing parts that would be considered to be similar using the above described algorithm for determining similarity. At step 2311 the user 2310 may design a part 2a which has a strength of 60 N/cm$^2$ and a weighs 30 Kg. Next at step 2313 the user may optimize part 2a to create part 2b with a strength of 50 N/cm$^2$ and weighs 10 Kg. In this example design path the user may continue to optimize part 2b. For example at step 2315, the user may create part 2c with a strength of 60 N/cm$^2$ and a weight of 15 Kg.

The design path taken by user 2320 may include a plurality of designs such as but not limited to, parts 3a, 3b, 3c, and 3d. Each part created iteratively may be an improvement upon the part in the previous step. The resulting part 3d will have strength of 50 N/cm$^2$ and weight of 7 Kg.

Figure 24:
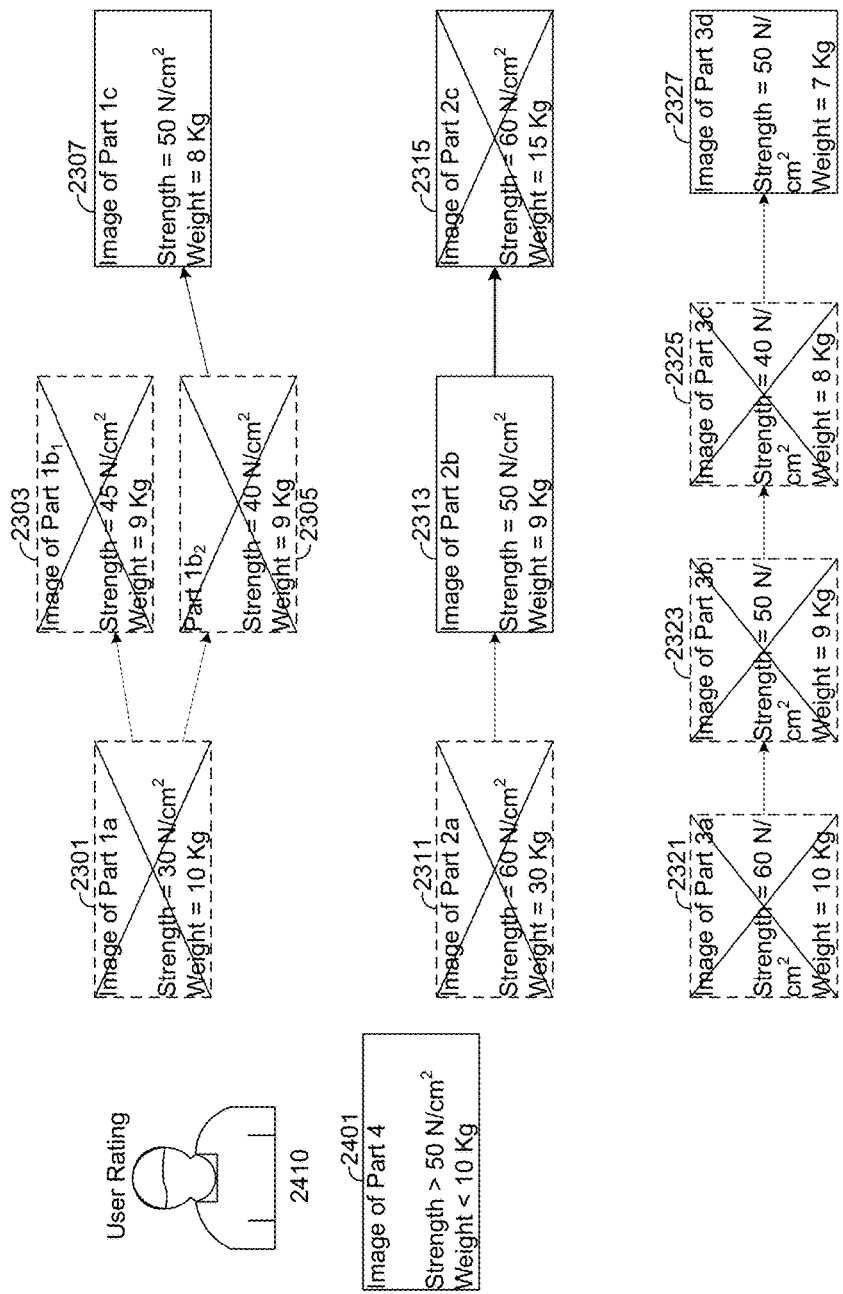
FIG. 24 illustrates the system showing which previously created parts meet the user criteria.

FIG. 24 illustrates a user 2410 that wishes to design a part 4 at step 2401 to have certain physical properties. For example, the user 2410 may specify that part 4 must have a strength that is greater than 50 N/cm$^2$ and weigh less than 10 Kg. The system may conduct a search among the parts that have been designed by various other users. In particular, after conducting a search the system may determine that various design paths may be displayed for the user 2410. In an example embodiment, the parts that are in the design path that do not meet the user 2410's criteria may be shown with a cross out through the parts that do not meet the user's criteria. For example, in the embodiment shown in FIG. 24 parts 1a, 1b1, 1b2, 2a, 2c, 3a, 3b, are 3c each crossed out in order to reflect the fact that those parts do not meet the user criteria. In another embodiment, the parts that are in the design flow of the other users may not be shown to user 2410.

FIG. 25a illustrates how the system may generate new parts based on previously generated results. For example, since part 1c and 2b are shown in FIG. 24, the say in which part 1c was modified from part 1b$_2$ may be that the materials of part 1c are able to be lighter and yet stronger than part 1b$_2$. With respect to part 2b a change in shape may be used by user 2310 to achieve the stronger yet lighted part. In this example, the properties that were modified are combinable and the system may generate and display an image of a new part 5 at step 2501. The system may also extrapolate and display the physical properties of the new resulting part. The system may initially determine the items that were changed to result in an improved physical property of a first part and then determine which optimization created a result in second part. The system may next determine if the two optimizations are combinable and if they are combinable the system may generate a new part.

FIG. 25b illustrates how the system may generate new parts based on previously generated results. For example, the user may request that the system generate a new part 6 based on the dead-end 1b$_1$ that the user 2301 abandoned a direction of change. In this example, the system generates a new part 6 from lessons learned in part 2c. In other words the user of part 2c may have determined how to overcome the dead end of part 1b$_1$.

Configurations of Various Exemplary Implementations

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, networked systems or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures may show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A method of suggesting a substitute object for a first simulated object for a Computer Aided Design (CAD) tool or in a Computer Aided Engineering (CAE) tool, comprising:
   improving suggestion of the substitute object for the first simulated object for the CAD tool or the CAE tool by:
   storing, with a processor of a computer system, a plurality of objects on a storage medium, each of the plurality of objects is a part of a model and is associated with a plurality of physical characteristics;
   determining, with the processor of the computer system, a plurality of physical characteristics of the first simulated object, wherein the plurality of physical characteristics of the first simulated object define physical properties of a physical object represented by the first simulated object;
   comparing, with the processor, the plurality of physical characteristics of the first simulated object to the plurality of physical characteristics of the plurality of objects stored on the storage medium;
   based on comparing the plurality of physical characteristics of the first simulated object to the plurality of physical characteristics of the plurality of objects, identifying, with the processor, at least one matching object from the plurality of objects stored on the storage medium;
   comparing, with the processor, at least one physical property of the at least one matching object to at least one user-specified physical property of the first simulated object to identify one or more of the at least one matching object that meet the at least one user-specified physical property;
   generating, with the processor, a list of the one or more of the at least one matching object that meet the at least one user-specified physical property as the substitute object for the first simulated object, wherein generating the list comprises: simulating the first simulated object with a plurality of components; arranging the plurality of components in a hierarchical graph to form the first simulated object; and generating redesign recommendations for one of the plurality of components based on redesign recommendation rules; and
   displaying the list with a user interface.

2. The method of claim 1, wherein the plurality of physical characteristics of the first simulated object and the plurality of physical characteristics of the plurality of objects comprise at least one of number of faces, type of face, protrusion or depression.

3. The method of claim 1, wherein the at least one physical property of the at least one matching object comprises at least one of, a material, tensile strength, weight of the first simulated object.

4. The method of claim 1, wherein each of the plurality of objects have already been optimized to meet the at least one user-specified physical property.

5. The method of claim 1, further comprising identifying, with the processor, a product in which each of the one or more of the at least one matching object was used in.

6. The method of claim 1, further comprising:
   determining, with the processor, objects that are connected to the first simulated object;
   determining, with the processor, objects that are connected to the at least one matching object;
   determining, with the processor, similarity between the objects connected to the first simulated object and the objects connected to the at least one matching object; and
   including the at least one matching object as a match based on a result of determining the similarity between the objects connected to the first simulated object and the objects connected to the at least one matching object.

7. The method of claim 1, wherein the at least one user-specified physical property is one or more of strength, weight, length, or width.

8. The method of claim 1, further comprising substituting an entirety of the first simulated object with an entirety of one object of the at least one matching objects.

9. The method of claim 3, wherein a material of the first simulated object is associated with physical property that is at least one of a boiling point, melting point, maximum stress-strain loan, strength, or malleability.

10. A system for suggesting a substitute object for a first simulated object in a Computer Aided Design (CAD) tool or in a Computer Aided Engineering (CAE) tool, comprising:
    a storage medium;
    a processor in communication with a non-transitory storage media, the processor configured to improve suggestion of the substitute object for the first simulated object for the CAD tool or the CAE tool by being configured to:
    store a plurality of objects on the storage medium, each of the plurality of objects is a part of a model and is associated with a plurality of physical characteristics;
    determine a plurality of physical characteristics of the first simulated object, wherein the plurality of physical characteristics of the first simulated object define physical properties of a physical object represented by the first simulated object;
    compare the plurality of physical characteristics of the first simulated object to the plurality of physical characteristics of the plurality of objects stored on the storage medium;
    based on comparing the plurality of physical characteristics of the first simulated object to the plurality of physical characteristics of the plurality of objects, identify at least one matching object from the plurality of objects stored on the storage medium;
    compare at least one physical property of the at least one matching object to at least one user-specified physical property of the first simulated object to identify one or more of the at least one matching object that meet the at least one user-specified physical property; and
    generate a list of the one or more of the at least one matching object that meet the at least one user-specified physical property as the substitute object for the first simulated object by: simulating the first simulated object with a plurality of components; arranging the plurality of components in a hierarchical graph to form the first simulated object; and generating redesign recommendations for one of the plurality of components based on redesign recommendation rules; and a user interface configured to display the list.

11. The system of claim 10, wherein the plurality of physical characteristics of the first simulated object and the plurality of physical characteristics of the plurality of objects comprises at least one of, number of faces, type of face, number of edges, protrusion or depression.

12. The system of claim 10, wherein the at least one physical property of the first simulated object and the plurality of physical characteristics of the plurality of objects comprises at least one of, a material, tensile strength, weight of the first simulated object.

13. The system of claim 10, wherein the plurality of objects have been optimized for at the least one user-specified physical property.

14. The system of claim 10, further comprising identifying a product that used each of the one or more of the at least one matching object.

15. The system of claim 10, wherein the processor configured to:
  determine objects that are connected to the first simulated object;
  determine objects that are connected to the at least one matching object;
  determine similarity between the objects connected to the first simulated object and the objects connected to the at least one matching object; and
  include the at least one matching object as a match based on a result of determining the similarity between the objects connected to the first simulated object and the objects connected to the at least one matching object.

16. A non-transitory processor readable storage media storing a program that when executed in a processor of a device causes the processor to perform a method for a Computer Aided Design (CAD) tool or in a Computer Aided Engineering (CAE) tool, the method of suggesting a substitute object for a first simulated object, comprising:
  improving suggestion of the substitute object for the first simulated object for the CAD tool or the CAE tool by:
  storing a plurality of objects on a storage medium, each of the plurality of objects is a part of a model and is associated with a plurality of physical characteristics
  determining a plurality of physical characteristics of the first simulated object, wherein the plurality of physical characteristics of the first simulated object define physical properties of a physical object represented by the first simulated object;
  comparing the plurality of physical characteristics of the first simulated object to the plurality of physical characteristics of the plurality of objects stored on the storage medium;
  based on comparing the plurality of physical characteristics of the first simulated object to the plurality of physical characteristics of the plurality of objects, identifying at least one matching object from the plurality of objects stored on the storage medium;
  comparing at least one physical property of the at least one matching object to at least one user-specified physical property of the first simulated object to identify one or more of the at least one matching object that meet the at least one user-specified physical property;
  generating a list of the one or more of the at least one matching object that meet the at least one user-specified physical property as the substitute object for the first simulated object, wherein generating the list comprises: simulating the first simulated object with a plurality of components; arranging the plurality of components in a hierarchical graph to form the first simulated object; and generating redesign recommendations for one of the plurality of components based on redesign recommendation rules; and
  displaying the list with a user interface.

17. The non-transitory processor readable storage media of claim 16, wherein the plurality of physical characteristics of the first simulated object and the plurality of physical characteristics of the plurality of objects comprises at least one of, number of faces, type of face, number of edges, protrusion or depression.

18. The non-transitory processor readable storage media of claim 16, wherein the at least one physical property of the at least one matching object comprises at least one of, a material, tensile strength, weight of the first simulated object.

19. The non-transitory processor readable storage media of claim 16, wherein the plurality of objects have been optimized for the at least one user-specified physical property.

20. The non-transitory processor readable storage media of claim 16, the method further comprising identifying a product that used each of the one or more of the at least one matching object.

21. The non-transitory processor readable storage media of claim 16,
  the method further comprising:
  determining objects that are connected to the first simulated object;
  determining objects that are connected to the at least one matching object;
  determining similarity between the objects connected to the first simulated object and the objects connected to the at least one matching object; and
  including the at least one matching object as a match based on a result of determining the similarity between the objects connected to the first simulated object and the objects connected to the at least one matching object.

* * * * *